US012598901B2

(12) United States Patent
Lim et al.

(10) Patent No.: US 12,598,901 B2
(45) Date of Patent: Apr. 7, 2026

(54) TOUCH SENSOR AND DISPLAY DEVICE INCLUDING THE SAME

(71) Applicant: SAMSUNG DISPLAY CO., LTD., Yongin-si (KR)

(72) Inventors: Hyung Chul Lim, Yongin-si (KR); Dae Hyun Noh, Yongin-si (KR); Dong Hyun Lee, Yongin-si (KR); Rac Yong Choi, Yongin-si (KR); Deuk Jong Kim, Yongin-si (KR); Hye Jin Kim, Yongin-si (KR); Wan Heui Lee, Yongin-si (KR); Tae Kyung Yim, Yongin-si (KR); Chae Kyung Jung, Yongin-si (KR)

(73) Assignee: SAMSUNG DISPLAY CO., LTD.

( * ) Notice: Subject to any disclaimer, the term of this patent is extended or adjusted under 35 U.S.C. 154(b) by 0 days.

(21) Appl. No.: 18/597,740

(22) Filed: Mar. 6, 2024

(65) Prior Publication Data

US 2024/0414992 A1 Dec. 12, 2024

(30) Foreign Application Priority Data

Jun. 8, 2023 (KR) ........................ 10-2023-0073612

(51) Int. Cl.
*G06F 3/041* (2006.01)
*G06F 3/044* (2006.01)
(Continued)

(52) U.S. Cl.
CPC ....... *H10K 59/8792* (2023.02); *G06F 3/0412* (2013.01); *G06F 3/04164* (2019.05);
(Continued)

(58) Field of Classification Search
CPC .. G06F 3/0412; G06F 3/0416; G06F 3/04164; G06F 3/044; G06F 3/0443;
(Continued)

(56) References Cited

U.S. PATENT DOCUMENTS 9,990,097 B2 6/2018 Park et al.
10,915,210 B2 2/2021 Lee et al.
(Continued)

FOREIGN PATENT DOCUMENTS

KR 10-0765582 B1 10/2007
KR 10-2012-0012005 A 2/2012
(Continued)

*Primary Examiner* — Nathan Danielsen
(74) *Attorney, Agent, or Firm* — F. CHAU & ASSOCIATES, LLC

(57) ABSTRACT

A display device includes a sensor layer including an active area and a non-active area at least partially surrounding the active area. A first sensor electrode is disposed in the active area of the sensor layer. A first wire is disposed in the non-active area of the sensor layer. The first wire includes a first wiring portion electrically connected to the first sensor electrode, having at least a part thereof extending in a first direction, and including at least two wiring layers, and a second wiring portion electrically connected to the first wiring portion, extending in a second direction crossing the first direction, and including a single wiring layer.

23 Claims, 20 Drawing Sheets

(51) Int. Cl.
 H10K 59/40 (2023.01)
 H10K 59/80 (2023.01)

(52) U.S. Cl.
 CPC .......... G06F 3/0443 (2019.05); G06F 3/0446
 (2019.05); H10K 59/40 (2023.02); *G06F*
 *2203/04107* (2013.01)

(58) Field of Classification Search
 CPC ...... G06F 3/0446; G06F 3/0448; G06F 3/046;
 G06F 2203/04107; H10K 59/40; H10K
 59/8792
 See application file for complete search history.

(56) References Cited

U.S. PATENT DOCUMENTS

| | | | |
|---|---|---|---|
| 2014/0042410 A1 | 2/2014 | Chen et al. | |
| 2016/0070394 A1* | 3/2016 | Van Ostrand | ........... G06F 3/047 |
| | | | 345/173 |
| 2016/0147361 A1* | 5/2016 | Ahn | ........................ G06F 3/041 |
| | | | 345/173 |
| 2016/0293631 A1* | 10/2016 | Sun | ........................ G06F 3/0412 |
| 2018/0203531 A1* | 7/2018 | Tsai | .................... G06F 3/04164 |
| 2019/0237533 A1* | 8/2019 | Kim | .................... H10K 59/122 |
| 2021/0184171 A1* | 6/2021 | Ohara | ................. H10K 59/131 |

FOREIGN PATENT DOCUMENTS

| | | |
|---|---|---|
| KR | 10-1397200 B1 | 5/2014 |
| KR | 10-2016-0123449 A | 10/2016 |
| KR | 10-2017-0010201 A | 1/2017 |
| KR | 10-1908982 B1 | 10/2018 |
| KR | 10-2020-0061056 A | 6/2020 |

* cited by examiner

PX: PX1, PX2, PX3
EA: EA1, EA2, EA3
TSE: TSE1, TSE2

FIG. 7

STL12(UTL)

TOUCH SENSOR AND DISPLAY DEVICE INCLUDING THE SAME

CROSS-REFERENCE TO RELATED APPLICATION

This application claims priority under 35 U.S.C. § 119 to Korean Patent Application No. 10-2023-0073612, filed in the Korean Intellectual Property Office (KIPO) on Jun. 8, 2023, the contents of which are herein incorporated by reference in their entirety.

TECHNICAL FIELD

The present disclosure relates to a display and, more particularly, to a touch sensor and a display device including the same.

DISCUSSION OF THE RELATED ART

A touch sensor is a device that detects a touch input generated by a user and is widely utilized in various types of electronic devices including display devices. For example, a display device may provide a convenient input function by incorporating a touch sensor within a display panel or disposed thereon.

SUMMARY

A display device includes a sensor layer including an active area and a non-active area at least partially surrounding the active area. A first sensor electrode is disposed in the active area of the sensor layer, and a first wire is disposed in the non-active area of the sensor layer. The first wire includes a first wiring portion electrically connected to the first sensor electrode, having at least a part thereof extending in a first direction, and including at least two wiring layers, and a second wiring portion electrically connected to the first wiring portion, extending in a second direction crossing the first direction, and including a single wiring layer.

The first direction may correspond to a lengthwise direction or a vertical direction of the active area, and the second direction may correspond to a widthwise direction or a horizontal direction of the active area.

The second wiring portion may be disposed proximate to a lower edge of the active area and may extend parallel to the lower edge of the active area.

The display device may further include a light blocker disposed in the non-active area at least partially surrounding the active area and having an opening exposing the active area and a portion of the non-active area disposed immediately proximate to the active area. The second wiring portion may be disposed in the portion of the non-active area overlapping the opening of the light blocker.

The non-active area may include a first non-active area disposed on a left side or right side of the active area and extending in the first direction, and a second non-active area disposed on a lower side of the active area and extending in the second direction, and the first wiring portion and the second wiring portion may be disposed in the first non-active area and the second non-active area, respectively.

The first wire may further include a third wiring portion extending in the first direction from one end of the second wiring portion in the second non-active area and including at least two wiring layers.

Each of the first wiring portion and the third wiring portion may include a first wiring layer and a second wiring layer overlapping the first wiring portion. The second wiring portion may be disposed on the same layer as the first wiring layer or the second wiring layer.

The second wiring portion may be integrally formed with the first wiring layer or the second wiring layer.

Each of the first wiring layer and the second wiring layer may have a multilayer structure including a first metal layer containing a first metal, a second metal layer disposed on the first metal layer and containing a second metal, and a third metal layer disposed on the second metal layer and containing a third metal. The first metal and the third metal may have a light reflectivity that is smaller than that of the second metal.

The sensor layer may further include an insulating layer interposed between the first wiring layer and the second wiring layer, and the first wiring layer and the second wiring layer may be electrically connected through a contact hole penetrating the insulating layer in each of the first wiring portion and the third wiring portion.

The display device may further include a second sensor electrode disposed in the active area of the sensor layer, and a second wire disposed in the non-active area of the sensor layer and electrically connected to the second sensor electrode. The second wire may include a first wiring portion disposed in the second non-active area and extending in the first direction, a second wiring portion extending in the second direction from one end of the first wiring portion of the second wire in the second non-active area and including a single wiring layer, and a third wiring portion extending from one end of the second wiring portion of the second wire in the second non-active area in the first direction and including at least two wiring layers.

The display device may further include a substrate including the active area and the non-active area, a display layer disposed on the substrate and including pixels disposed in the active area, and an encapsulation layer disposed on the display layer and encapsulating the pixels. The sensor layer may be disposed on the encapsulation layer.

A display device includes a sensor layer including an active area and a non-active area at least partially surrounding the active area. A sensor electrode is disposed in the active area of the sensor layer, and a wire is disposed in the non-active area of the sensor layer, the wire including a first wiring portion electrically connected to the sensor electrode and having at least a part thereof extending in a first direction, and a second wiring portion electrically connected to the first wiring portion and extending in a second direction crossing the first direction. The second wiring portion includes a first wiring layer extending in the second direction in the non-active area, and a second wiring layer disposed on an insulating layer covering the first wiring layer, extending in the second direction in the non-active area and overlapping the first wiring layer, and covering a top surface of the first wiring layer while having a width that is larger than that of the top surface of the first wiring layer.

The first direction may correspond to a lengthwise direction or a vertical direction of the active area, and the second direction may correspond to a widthwise direction or a horizontal direction of the active area.

The second wiring portion may be disposed proximate to a lower edge of the active area and may extend parallel to the lower edge of the active area.

The display device may further include a light blocker disposed in the non-active area at least partially surrounding the active area, and having an opening exposing the active area and a portion of the non-active area disposed immediately proximate to the active area. The second wiring portion may be disposed in the portion of the non-active area overlapping the opening of the light blocker.

Each of the first wiring layer and the second wiring layer may have a multilayer structure including a first metal layer containing a first metal, a second metal layer disposed on the first metal layer and containing a second metal, and a third metal layer disposed on the second metal layer and containing a third metal, and the first metal and the third metal may have a light reflectivity that is smaller than that of the second metal.

At least one of the first metal layer and the third metal layer of the second wiring layer may completely cover the second metal layer of the first wiring layer.

The non-active area may include a first non-active area disposed on a left side or right side of the active area and extending in the first direction, and a second non-active area disposed on a lower side of the active area and extending in the second direction, and the first wiring portion and the second wiring portion may be disposed in the first non-active area and the second non-active area, respectively.

The wire may further include a third wiring portion extending in the first direction from one end of the second wiring portion in the second non-active area, and each of the first wiring portion and the third wiring portion may include a first wiring layer integral with the first wiring layer of the second wiring portion, and a second wiring layer disposed on the insulating layer, overlapping the first wiring layer of each of the first wiring portion and the third wiring portion, and integral with the second wiring layer of the second wiring portion.

A touch sensor includes an active area and a non-active area at least partially surrounding the active area. A sensor electrode is disposed in the active area. A wire is disposed in the non-active area. The wire includes a first wiring portion electrically connected to the sensor electrode, having at least a part thereof extending in a first direction, and including at least two wiring layers, and a second wiring portion electrically connected to the first wiring portion, extending in a second direction crossing the first direction, and including a single wiring layer.

The first direction may correspond to a lengthwise direction or a vertical direction of the active area, and the second direction may correspond to a widthwise direction or a horizontal direction of the active area.

The second wiring portion may be disposed proximate to a lower edge of the active area and may extend parallel to the lower edge of the active area.

The non-active area may include a first non-active area disposed on a left side or right side of the active area and extending in the first direction, and a second non-active area disposed on a lower side of the active area and extending in the second direction, and the first wiring portion and the second wiring portion may be disposed in the first non-active area and the second non-active area, respectively.

The wire may further include a third wiring portion extending in the first direction from one end of the second wiring portion in the second non-active area and including at least two wiring layers.

BRIEF DESCRIPTION OF THE DRAWINGS

The above and other aspects and features of the present disclosure will become more apparent by describing in detail embodiments thereof with reference to the attached drawings, in which:

FIG. 7 is a cross-sectional view illustrating the display panel according to an embodiment;

FIG. 15 is a plan view illustrating a part of the sensor layer according to an embodiment;

FIG. 17 is a cross-sectional view illustrating an embodiment of a cross section corresponding to line J-J' of FIG. 16;

DETAILED DESCRIPTION OF THE EMBODIMENTS

Embodiments of the present invention will now be described more fully hereinafter with reference to the accompanying drawings. The invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when an element or a layer is referred to as being "on" another element or layer, it can be directly on the other element or layer, or intervening layers may also be present. The same reference numbers may indicate the same components throughout the specification and the drawings.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Figure 1:
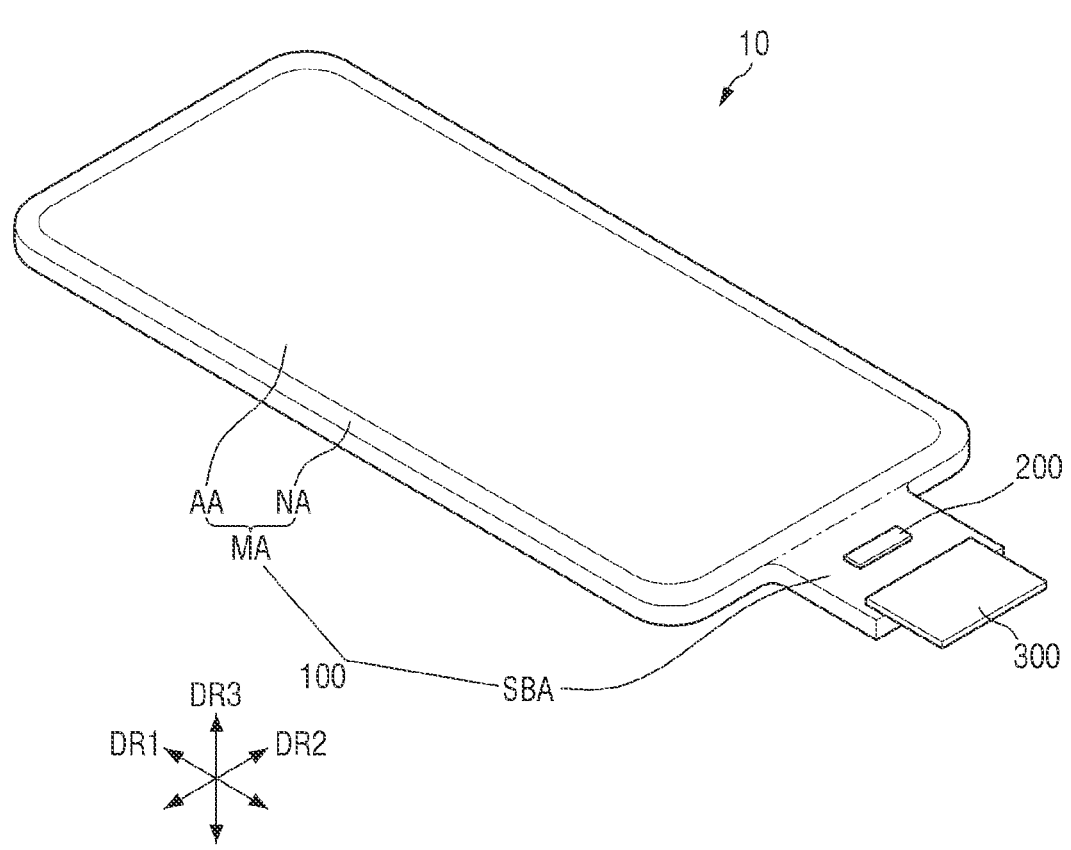
FIG. 1 is a perspective view illustrating a display device according to an embodiment.

FIG. 1 is a perspective view illustrating a display device 10 according to an embodiment.

Referring to FIG. 1, a display device 10 is a device for displaying a moving image or a still image. The display device 10 may be used as a display screen of various devices, such as a television, a laptop computer, a computer monitor, a digital billboard, and/or an Internet-of-Things (IoT) device, as well as portable electronic devices such as a mobile phone, a smartphone, a tablet computer, a smart watch, a watch phone, a mobile communication terminal, an electronic notebook, an electronic book, a portable multimedia player (PMP), a navigation device, and/or an ultramobile PC (UMPC).

The display device 10 may be a light emitting display device such as an organic light emitting display (OLED) including an organic light emitting diode, a quantum dot light emitting display including a quantum dot light emitting layer, an inorganic light emitting display including an inorganic semiconductor, or a micro light emitting display using a micro or nano light emitting diode (LED). In the following, an embodiment in which the display device 10 is an organic light emitting display device is described, but the type of display device 10 is not necessarily limited thereto.

In an embodiment, the display device 10 may be formed flat. For example, the display device 10 may be formed substantially flat on a plane defined by a first direction DR1 and a second direction DR2, and may have a predetermined and consistent thickness (or height) in a third direction DR3. In an embodiment, the display device 10 may include a curved surface in at least a part including an edge region and the like. In addition, the display device 10 may be formed flexibly so that it can be curved, bent, folded, or rolled to at least a noticeable degree without sustaining damage such as cracking.

In an embodiment, the first direction DR1 may be a direction corresponding to a lengthwise direction, a column direction, or a vertical direction of an active area AA. The second direction DR2 may be a direction intersecting the first direction DR1, and may be, for example, a direction corresponding to a widthwise direction, a row direction, or a horizontal direction of the active area AA. For example, the first direction DR1 may be a direction coincident with or parallel to a lengthwise direction, a column direction, or a perpendicular direction of the active area AA, and the second direction DR2 may be a direction coincident with or parallel to a widthwise direction, a row direction, or a horizontal direction of the active area AA. The third direction DR3 may be a direction crossing the first direction DR1 and the second direction DR2, and may be, for example, a direction orthogonal to a plane defined by the first direction DR1 and the second direction DR2. For example, the third direction DR3 may be a thickness direction or a height direction of the display device 10.

The display device 10 may include a display panel 100, a display driving circuit 200, and a circuit board 300.

The display panel 100 may include a main region MA including the active area AA in which an image is displayed, and a sub-region SBA located on one side of the main region MA.

The main region MA may include the active area AA and a non-active area NA at least partially surrounding the active area AA. The active area AA may be disposed in the center of the main region MA and occupy most of the area in the main region MA. The non-active area NA may be disposed at an edge of the main region MA and may be in contact with the sub-region SBA.

The active area AA may include a display area and a sensing area. The display area may be an area in which pixels are disposed and/or arranged, and may be an area in which an image is displayed by pixels PX. The sensing area may be an area in which sensor electrodes (also referred to as "sensing patterns"), for example, the sensor electrodes of a touch sensor, are disposed and/or arranged, and may be an area in which a touch input or the like is sensed by the sensor electrodes (e.g., touch sensing area). In an embodiment, the display area and the sensing area may be substantially the same area or may at least partially overlap each other.

In an embodiment, the active area AA may include a pair of long sides extending in the first direction DR1 and a pair of short sides extending in the second direction DR2 and may be formed as a plane having an approximately rectangular shape. A corner portion at which the long side and the short side of the active area AA meet may be rounded or right-angled. The shape of the active area AA may be variously changed according to embodiments. For example, the active area AA may be formed in a polygonal shape other than a quadrilateral shape, a circular shape, an elliptical shape, or the like.

The non-active area NA may be disposed proximate to the active area AA. For example, the non-active area NA may be in contact with an edge of the active area AA and may at least partially surround the active area AA. The non-active area NA may include a dam area, an inorganic encapsulation area, or the like. In an embodiment, an embedded circuit may be disposed in the non-active area NA. For example, an embedded circuit including a scan driving circuit or the like may be disposed in the non-active area NA disposed on one side (e.g., the left side or the right side) or both sides of the active area AA.

The sub-region SBA may be located on one side of the main region MA. For example, the sub-region SBA may protrude in the first direction DR1 from one side of the main region MA. For example, the sub-region SBA may protrude in the first direction DR1 from the lower end of the main region MA. In an embodiment, the sub-region SBA may have a narrower width than the main region MA. For example, with respect to the second direction DR2, the sub-region SBA may have a narrower width than the main region MA.

Wirings and pads may be disposed in the sub-region SBA. For example, in the sub-region SBA, the wirings and pads electrically connected to the pixels, the sensor electrodes and/or the embedded circuit disposed in the main region MA and to the display driving circuit 200 and/or the circuit board 300 disposed in the sub-region SBA may be disposed. At least some of the wirings may be electrically connected to the pixels and the sensor electrodes disposed in the active area AA, inside the active area AA or proximate to the active area AA, and may extend to the sub-region SBA through the non-active area NA of the main region MA. In describing embodiments, the term "connect" may include electrical connection and/or physical connection.

In an embodiment, the display driving circuit 200 (e.g., the display driving circuit) may be mounted in the sub-region SBA. The circuit board 300 may be disposed on a portion of the sub-region SBA.

The display driving circuit 200 may include a data driving circuit to drive pixels. In an embodiment, the display driving circuit 200 may be implemented as an integrated circuit chip (IC) and mounted in the sub-region SBA. In an embodiment, the display driving circuit 200 may be disposed on the circuit board 300 on the sub-region SBA or may be disposed on another circuit board electrically connected to the display panel 100 through the circuit board 300.

The circuit board 300 may be disposed on a portion of the sub-region SBA. For example, the circuit board 300 may be bonded on the pads disposed on a portion (e.g., a lower edge) of the sub-region SBA, and may supply or transmit power voltages and driving signals for driving the display panel 100 to the display panel 100. For example, the circuit board 300 may supply input image data (e.g., digital image data), driving signals including timing signals, and driving voltages to the display panel 100. In an embodiment, the circuit board 300 may supply driving signals for driving at least some of the sensor electrodes (e.g., driving electrodes) to the display panel 100 and may receive sensing signals outputted from at least some of the sensor electrodes (e.g., sensing electrodes). The circuit board 300 may be a flexible film such as a flexible printed circuit board (FPCB), a printed circuit board (PCB), or a chip on film (COF), but is not necessarily limited thereto.

Figure 2:
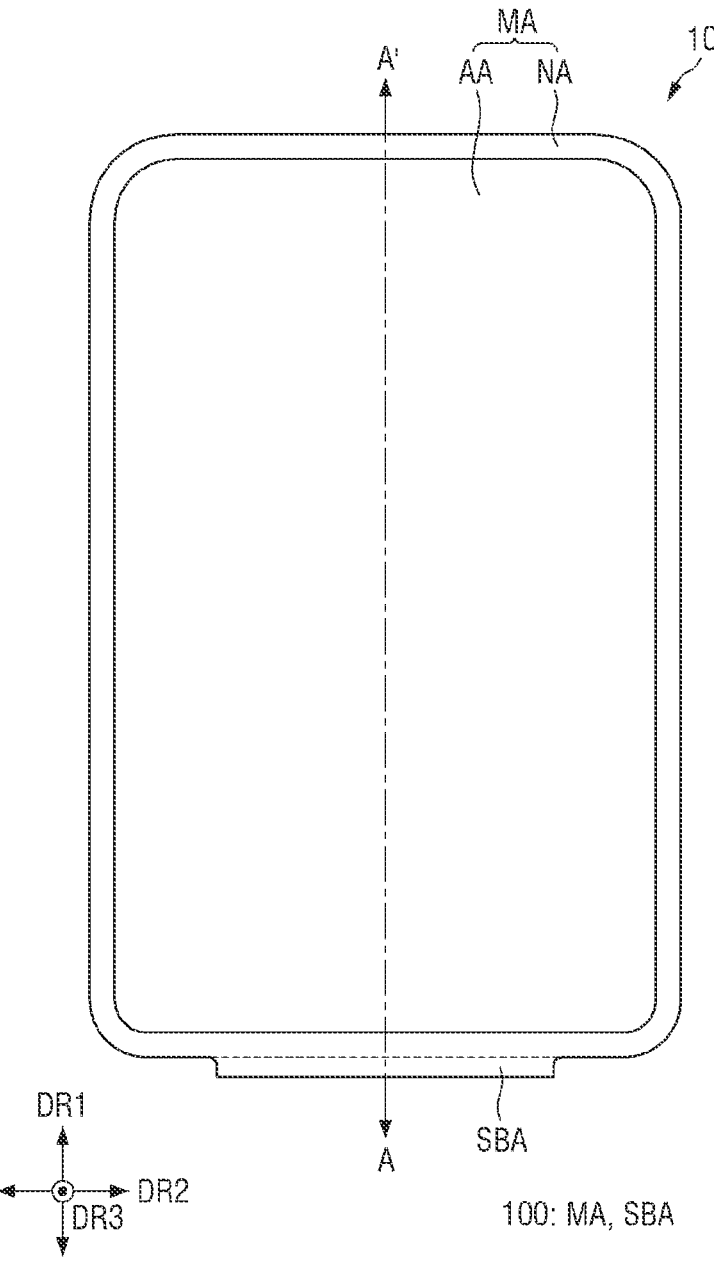
FIG. 2 is a plan view illustrating the display device of FIG. 1.
Figure 3:
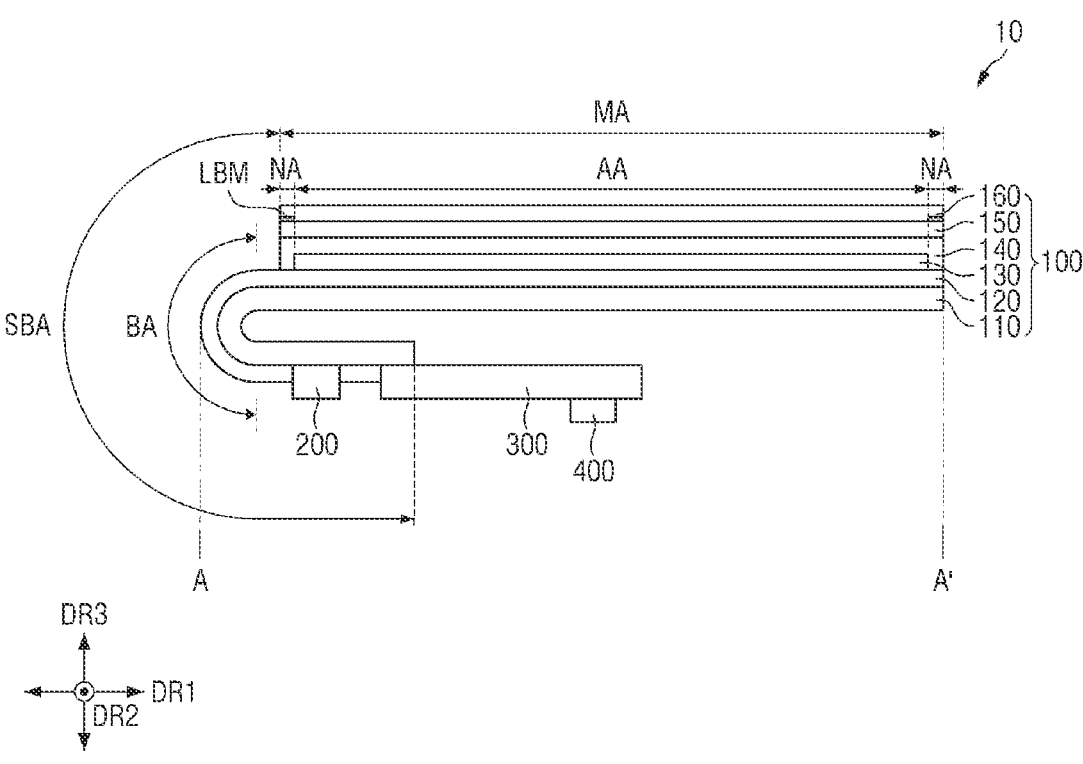
FIG. 3 is a cross-sectional view illustrating an embodiment of a cross section corresponding to line A-A' of FIG. 2.

FIG. 2 is a plan view illustrating the display device 10 of FIG. 1. FIG. 3 is a cross-sectional view illustrating an embodiment of a cross section corresponding to line A-A' of FIG. 2.

FIG. 1 shows the display device 10 in an unfolded state without bending, and FIGS. 2 and 3 show the display device 10 in a folded state that is bent in the sub-region SBA. For example, FIG. 1 shows the sub-region SBA unfolded alongside the main region MA, and FIGS. 2 and 3 show a part of the sub-region SBA in the folded state.

Referring to FIGS. 2 and 3 in addition to FIG. 1, the display panel 100 may include a substrate 110 including the main region MA and the sub-region SBA, and a circuit layer 120, a light emitting element layer 130, and an encapsulation layer 140 sequentially disposed on the substrate 110. The circuit layer 120 and the light emitting element layer 130 may constitute a display layer including various pixels. The circuit layer 120 may be disposed in the main region MA and the sub-region SBA on the substrate SUB. The light emitting element layer 130 and the encapsulation layer 140 may be disposed on a portion of the substrate 110 and the circuit layer 120. For example, the light emitting element layer 130 and the encapsulation layer 140 may be disposed in the main region MA.

The display panel 100 may further include a sensor layer 150 (e.g., a touch sensor layer) disposed on the encapsulation layer 140. The position of the sensor layer 150 is not necessarily limited thereto, and the sensor layer 150 may be disposed separately from the display panel 100 and disposed on the display panel 100. For example, the display device 10 may include a sensor layer 150 manufactured integrally with the display panel 100 or manufactured separately from the display panel 100. When the sensor layer 150 is manufactured separately from the display panel 100, the sensor layer 150 may include a separate base member (e.g., a substrate or a film).

The sensor layer 150 may include sensor electrodes and wirings electrically connected to the sensor electrodes. In an embodiment, the sensor layer 150 may be a touch sensor layer constituting a touch sensor. For example, the touch sensor may include the sensor layer 150 including sensor electrodes and wirings, and may selectively further include a touch driving circuit 400. The touch driving circuit 400 may be disposed in a touch sensor, or may be disposed in a circuit substrate or a host device or the like electrically connected to the touch sensor.

The sensor layer 150 may be disposed in at least the main region MA, and may include the active area AA and the non-active area NA. The sensor layer 150 may include sensor electrodes disposed in the active area AA and wirings electrically connected to the sensor electrodes and passing through the non-active area NA. In an embodiment, wirings may extend from the main region MA to the sub-region SBA. The sensor layer 150 may sense a touch input or the like generated in the active area AA by using sensor electrodes.

In an embodiment, the display device 10 may further include an additional element disposed on the sensor layer 150. For example, the display device 10 may further include at least one of an optical layer 160 (e.g., a polarization layer or a color filter layer) or a passivation layer (e.g., a window or a protective film) disposed on the sensor layer 150. In an embodiment, the optical layer 160 and/or the passivation layer may be disposed on the display panel 100. For example, the optical layer 160 and/or the passivation layer may be integrally manufactured with the display panel 100. In an embodiment, the optical layer 160 and/or the passivation layer may be manufactured separately from the display panel 100 and attached to the display panel 100 via an adhesive layer or the like.

In an embodiment, the display device 10 may further include a light blocker LBM (also referred to as a "light blocking pattern" or a "black matrix pattern") disposed on the sensor layer 150 to cover at least a part of the non-active area NA. The light blocker LBM may be disposed or formed on one surface of the optical layer 160 or the passivation layer facing the sensor layer 150, but is not necessarily limited thereto. For example, the light blocker LBM may be directly disposed or formed on one surface of the sensor layer 150. In an embodiment, the light blocker LBM may have a single-layer or multilayer structure including a black matrix, or may have a multilayer structure in which at least two color filters such as a red color filter and a blue color filter are stacked.

Although FIG. 3 illustrates that the optical layer 160 and the light blocker LBM are disposed only in the main region MA, embodiments are not necessarily limited thereto. For example, the optical layer 160 and the light blocker LBM may also be disposed in a portion of the sub-region SBA immediately adjacent to the main region MA.

The substrate 110 may include an insulating material such as a polymer resin. For example, the substrate 110 may be made of polyimide or another insulating material. The substrate 110 may be a flexible substrate that can be transformed, such as bending, folding, or rolling. Alternatively, the substrate 110 may include an insulating material such as glass. The substrate 110 may include the main region MA including the active area AA and the non-active area NA, and the sub-region SBA extending from one side of the main region MA.

The circuit layer 120 may include pixel circuits and wirings. For example, the circuit layer 120 may include circuit elements (e.g., pixel transistors and capacitors) constituting a pixel circuit for each pixel, and wirings electrically connected to the pixels. In an embodiment, the circuit layer 120 may further include circuit elements constituting an embedded circuit, such as a scan driving circuit, and wirings electrically connected to the embedded circuit.

The light emitting element layer 130 may include light emitting elements disposed in emission areas of the pixels. For example, each pixel may include at least one light emitting element and a pixel circuit electrically connected to the light emitting element. Each pixel may be located in a pixel region, including the emission area where the light emitting element is disposed and a pixel circuit area where the pixel circuit is disposed. The emission area and the pixel circuit area of each pixel may overlap each other, but the present disclosure is not necessarily limited thereto.

In describing the embodiments, the circuit layer 120 and the light emitting element layer 130 are separately described, but the embodiments are not necessarily limited thereto. For example, the circuit layer 120 and the light emitting element layer 130 may be integrated.

The encapsulation layer 140 may be disposed on the light emitting element layer 130 to encapsulate pixels disposed in the active area AA of the circuit layer 120 and the light emitting element layer 130. The encapsulation layer 140 may extend into the non-active area NA to be in contact with the circuit layer 120. In an embodiment, the encapsulation layer 140 may have a multilayer structure including at least two inorganic encapsulation films overlapping each other and at least one organic encapsulation film interposed between the inorganic encapsulation films.

The sensor layer 150 may be disposed on the encapsulation layer 140 and disposed at least in the main region MA. In an embodiment, the sensor layer 150 may be a touch sensor layer, and may include sensor electrodes for detecting a touch input (direct touch, proximity, or the like) from a person or an object. In this case, the sensor layer 150 may constitute or form a touch sensor. The sensor layer 150 may include sensor electrodes disposed in the active area AA and wirings electrically connected to the sensor electrodes. In an embodiment, wirings of the sensor layer 150 may extend from the main region MA to the sub-region SBA and be electrically connected to pads disposed in the sub-region SBA.

The optical layer 160 may be disposed on the sensor layer 150 (or the encapsulation layer 140). In an embodiment, the optical layer 160 may include at least one of a polarization layer or a color filter layer and may block external light reflected from the sensor layer 150, the encapsulation layer 140, the light emitting element layer 130, the circuit layer 120 and at an interface therebetween. Accordingly, deterioration in visibility of an image due to reflection of external light may be prevented.

The light blocker LBM may be disposed in the non-active area NA to surround the active area AA. For example, the light blocker LBM may be opened to expose at least the active area AA and may be disposed on an edge area of the sensor layer 150.

The light blocker LBM may be disposed or formed on one surface of the sensor layer 150 or the optical layer 160. For example, the light blocker LBM may be directly printed on one surface of the optical layer 160. Accordingly, the printing accuracy of the light blocker LBM may be increased, and the light blocker LBM may be formed more clearly. However, the position and/or forming method of the light blocker LBM is not necessarily limited thereto. For example, the light blocker LBM may be disposed or disposed on one surface of a window or the like disposed above the display panel 100.

In an embodiment, the display panel 100 may be bent in a bending area BA. The bending area BA may be a part of the sub-region SBA and may be spaced apart from the main region MA.

The substrate 110 and the circuit layer 120 may be bent in the bending area BA corresponding to a partial section of the sub-region SBA. Accordingly, the bezel area recognized by a user as the non-active area NA may be reduced or minimized.

In an embodiment, the display device 10 may further include a window disposed on the optical layer 160 to protect the display panel 100. The window may be attached to the optical layer 160 by a transparent adhesive member such as an optically clear adhesive (OCA) film or an optically clear resin (OCR). Alternatively, the window may be manufactured integrally with the display panel 100. The window may include an inorganic material such as glass or an organic material such as plastic or a polymer material.

In an embodiment, the display device 10, according to an embodiment, may further include a touch driving circuit 400 for driving the sensor layer 150. In an embodiment, the touch driving circuit 400 may be implemented as an integrated circuit chip (IC), and may be mounted on the circuit board 300 bonded to the pads in the sub-region SBA to be electrically connected to the sensor layer 150. Alternatively, similarly to the display driving circuit 200, the touch driving circuit 400 may be mounted on the substrate 110. For example, the touch driving circuit 400 may be mounted on the sub-region SBA.

The touch driving circuit 400 may apply a touch driving signal to at least some of the sensor electrodes disposed on the sensor layer 150 and receive a touch sensing signal through at least some of the sensor electrodes. For example, when the sensor layer 150 includes driving electrodes and sensing electrodes constituting mutual capacitive sensor electrodes, the touch driving circuit 400 may apply a touch driving signal to the driving electrodes, receive a touch sensing signal of each of touch nodes through the sensing electrodes, and detect a change in the charge of mutual capacitance based on the touch sensing signal. Accordingly, the touch driving circuit 400 (or a host processor receiving the electrical signal corresponding to the touch sensing signal from the touch driving circuit 400) may determine whether a user has touched or approached and the position thereof or the like based on the touch sensing signal of each of the touch nodes.

Figure 4:
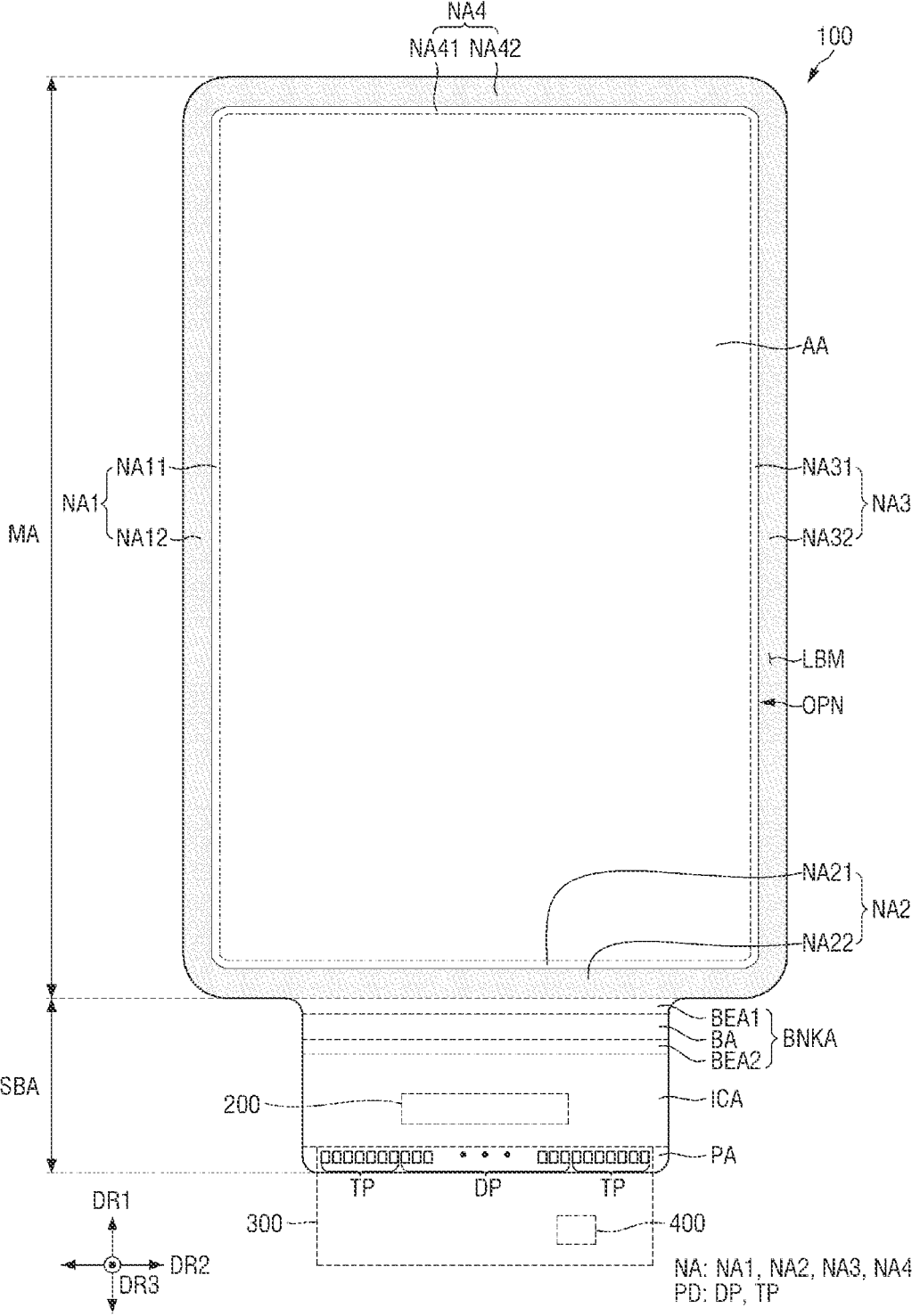
FIG. 4 is a plan view illustrating the display panel according to an embodiment.

FIG. 4 is a plan view illustrating the display panel 100 according to an embodiment. FIG. 4 shows the display panel 100 in an unbent and unfolded state.

Referring to FIG. 4 in addition to FIGS. 1 to 3, the display panel 100 may include the main region MA including the active area AA and the non-active area NA, and the sub-region SBA including a bank area BNKA, a driving circuit mounting area ICA, a pad area PA, or the like.

The active area AA may be an area in which pixels and sensor electrodes are disposed. For example, the pixels PX illustrated in FIG. 6 and sensor electrodes TSE illustrated in FIG. 5 or 6 may be disposed in the active area AA.

The non-active area NA may be disposed proximate to the active area AA. For example, the non-active area NA may be a remaining area of the main region MA excluding the active area AA, and may be an edge area of the main region MA disposed outside the active area AA to surround the active area AA.

In an embodiment, the non-active area NA may include first, second, third, and fourth non-active areas NA1, NA2, NA3, and NA4 disposed on different sides of the active area AA. For example, when viewed on a plane defined by the first direction DR1 and the second direction DR2, the non-active area NA may include the first non-active area NA1 disposed on the left side of the active area AA and extending in the first direction DR1, the second non-active area NA2 disposed on the lower side of the active area AA and extending in the second direction DR2, the third non-active area NA3 disposed on the right side of the active area AA and extending in the first direction DR1, and the fourth non-active area NA4 disposed above the active area AA and extending in the second direction DR2. The first non-active area NA1 and the third non-active area NA3 may be disposed on both sides of the active area AA in the second direction DR2. The second non-active area NA2 and the fourth non-active area NA4 may be disposed on both sides of the active area AA in the first direction DR1.

The pixels and sensor electrodes disposed in the active area AA may be electrically connected to the display driving circuit 200, the touch driving circuit 400, and/or the pads PD by wirings passing through the non-active area NA. For example, the wirings may be electrically connected to each of the pixels and each of the sensor electrodes inside the active area AA and/or at the boundary between the active area AA and the non-active area NA, and may pass through at least the second non-active area NA2 to extend to the sub-region SBA. At least some of the wirings may pass through the second non-active area NA2 from the first non-active area NA1 or the third non-active area NA3 to extend to the sub-region SBA.

In an embodiment, the light blocker LBM may be disposed in the non-active area NA of the display panel 100. For example, the light blocker LBM may be disposed in the non-active area NA of the display panel 100 on the sensor layer 150 to surround the active area AA. The light blocker LBM may have an opening OPN exposing the active area AA and portions NA11, NA21, NA31, and N41 of the non-active area NA disposed immediately proximate to the active area AA. For example, the light blocker LBM may be opened by an area equal to or larger than active area AA such that the light blocker LBM does not cover the active area AA in consideration of an error range, a viewing angle or the like that may occur in a forming process and/or a disposition process or the like of the light blocker LBM. The light blocker LBM may be disposed on the sensor layer 150 to cover remaining portions NA12, NA22, NA32, and N42 of the non-active area NA.

The sub-region SBA may include the bank area BNKA, the driving circuit mounting area ICA, and the pad area PA sequentially disposed on one side of the main region MA. Wirings (or parts of wirings), banks, and the pads PD may be disposed in the sub-region SBA. At least some of the wirings may extend into the main region MA and be electrically connected to pixels and/or sensor electrodes.

The bank area BNKA may be an area in which a bank including at least one organic layer is disposed. In an embodiment, the bank area BNKA may include the bending area BA. For example, the bank area BNKA may include the bending area BA spaced apart from the main region MA, and a first edge area BEA1 and a second edge area BEA2 disposed on both sides of the bending area BA in the first direction DR1. The bank may be disposed in the bending area BA and the peripheral areas thereof (e.g., the first edge area BEA1 and the second edge area BEA2 of the bank area BNKA) to cover wirings passing through the bending area BA. In an embodiment, inorganic insulating layers disposed on the display panel 110 may be removed in the bending area BA. Wirings passing through the bending area BA may be covered by a bank including at least one organic insulating layer. The display panel 100 may be bent in the bending area BA such that a portion of the sub-region SBA may be disposed behind the main region MA.

The driving circuit mounting area ICA may be an area in which the display driving circuit 200 is mounted. Input/output pads for connecting at least some of the wirings to the display driving circuit 200 may be disposed in the driving circuit mounting area ICA. For example, in the driving circuit mounting area ICA, input pads for connecting the display driving circuit 200 to the specific pads (e.g., data input pads) of the pad area PA and output pads for connecting the display driving circuit 200 to the pixels PX may be disposed.

In some embodiments, the display driving circuit 200 might not be mounted on the display panel 100. In this case, the display panel 100 might not include the driving circuit mounting area ICA, and only wirings may be disposed between the bank area BNKA and the pad area PA.

The pad area PA may be an area in which the pads PD for transmitting power voltages and driving signals necessary for driving the display panel 100 are disposed or arranged. The pads PD may include first pads DP for displaying an image (e.g., display pads) and second pads TP for sensing a touch input (e.g., touch pads). For example, the first pads DP may include power pads and signal pads electrically connected to the pixels and/or embedded circuits of the display panel 100 and the display driving circuit 200, and the second pads TP may include signal pads electrically connected to sensor electrodes. The circuit board 300 may be disposed or bonded on the pads PD.

Figure 5:
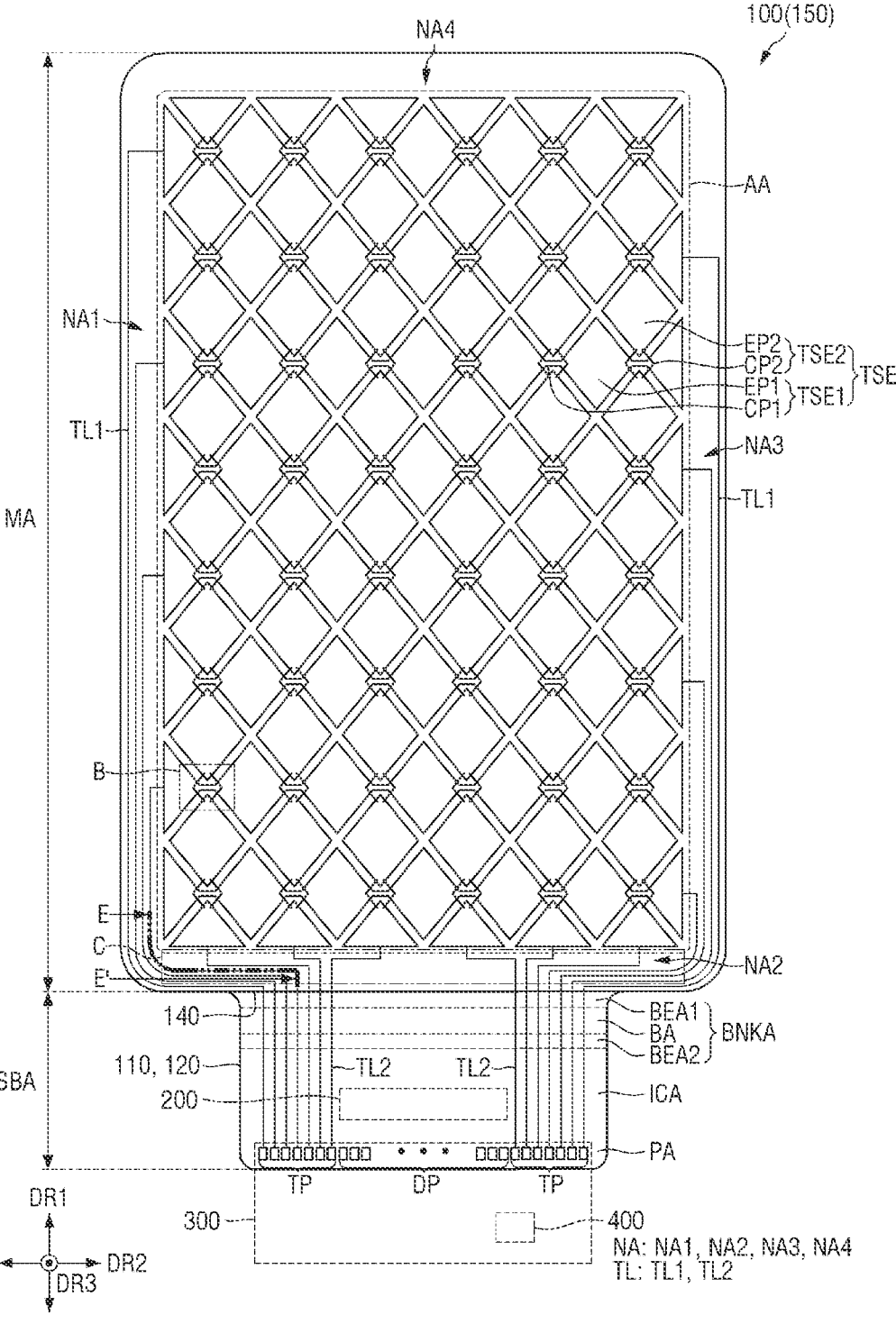
FIG. 5 is a plan view showing the sensor layer according to an embodiment.

FIG. 5 is a plan view showing the sensor layer 150 according to an embodiment. For example, FIG. 5 is a plan view illustrating an example of the sensor layer 150 that may be disposed on the display panel 100 of FIG. 4, and illustrates a state in which the display panel 100 is not bent but unfolded.

FIG. 5 illustrates the sensor layer 150 of a capacitance method, but embodiments are not necessarily limited thereto. For example, the type and structure of the sensor layer 150 may be variously changed according to embodiments.

Referring to FIG. 5 in addition to FIGS. 1 to 4, the sensor layer 150 may include the sensor electrodes TSE disposed in the main region MA and wires TL ("sensor lines" or "touch trace lines") electrically connected to the sensor electrodes TSE. For example, the sensor layer 150 may include the active area AA and the non-active area NA, the sensor electrodes TSE may be disposed in the active area AA of the sensor layer 150, and the wire TL may be disposed in the non-active area NA of the sensor layer 150.

In an embodiment, the wires TL may extend from the main region MA to the sub-region SBA. For example, one part of the wires TL may be disposed in the main region MA and electrically connected to each of the sensor electrodes TSE, and another part of the wires TL may be disposed in the sub-region SBA and electrically connected to each of the second pads TP.

In an embodiment, the sensor layer 150 may be formed integrally with the display panel 100. For example, one part of the wires TL and the sensor electrodes TSE disposed in the main region MA may be formed on the encapsulation layer 140, and another part of the wires TL disposed in the sub-region SBA may be formed on the substrate 110 and/or the circuit layer 120.

The sensor electrodes TSE may be disposed in the active area AA. In an embodiment, the sensor electrodes TSE may include first sensor electrodes TSE1 and second sensor electrodes TSE2 extending in different directions. For example, the first sensor electrodes TSE1 may be sequentially and/or continuously arranged along the first direction DR1, and each may extend in the second direction DR2. The second sensor electrodes TSE2 may be sequentially and/or continuously arranged along the second direction DR2, and each may extend in the first direction DR1. The first sensor electrodes TSE1 and the second sensor electrodes TSE2 may cross each other.

Each of the first sensor electrodes TSE1 may include first electrode cells EP1 (also referred to as "first electrode portions") and first connection portions CP1. In each of the first sensor electrodes TSE1, the first electrode cells EP1 may be arranged along the second direction DR2, and the first connection portions CP1 may connect the first electrode cells EP1.

In an embodiment, each of the first electrode cells EP1 may have a plate-shaped pattern having an approximately rhombic shape or having another shape (e.g., a quadrilateral shape, a hexagonal shape, a circular shape, or the like). In an embodiment, each of the first electrode cells EP1 may have a mesh shaped pattern.

In an embodiment, the first connection portions CP1 may be integrally formed with the first electrode cells EP1. In an embodiment, the first connection portions CP1 may be formed of bridge-shaped electrically conductive patterns that are non-integral (e.g., separately formed) with the first electrode cells EP1. In each of the first sensor electrodes TSE1, at least one first connection portion CP1 may be formed between two adjacent first electrode cells EP1.

Each of the second sensor electrodes TSE2 may include second electrode cells EP2 (also referred to as "second electrode portions") and second connection portions CP2. In each of the second sensor electrodes TSE2, the second electrode cells EP2 may be arranged along the first direction DR1, and the second connection portions CP2 may connect the second electrode cells EP2.

In an embodiment, each of the second electrode cells EP2 may have a plate-shaped pattern having an approximately rhombic shape or having another shape (e.g., a quadrilateral shape, a hexagonal shape, a circular shape, or the like). In an embodiment, each of the second electrode cells EP2 may have a mesh shaped pattern.

In an embodiment, the second connection portions CP2 may be formed of bridge-shaped electrically conductive patterns that are non-integral with the second electrode cells EP2. In an embodiment, the second connection portions CP2 may be integrally formed with the second electrode cells EP2. In each of the second sensor electrodes TSE2, at least one second connection portion CP2 may be formed between two adjacent second electrode cells EP2. For example, in each of the second sensor electrodes TSE2, two second connection portions CP2 may be formed between two adjacent second electrode cells EP2.

The sensor electrodes TSE may include at least one electrically conductive material, and a constituent material of the sensor electrodes TSE is not particularly limited thereto. In an embodiment, each of the first electrode cell EP1, the second electrode cell EP2, the first connection portion CP1 and/or the second connection portion CP2 may have a multilayer structure in which at least two electrically conductive layers are stacked. For example, each of the first electrode cell EP1, the second electrode cell EP2, the first connection portion CP1 and/or the second connection portion CP2 may have the same multilayer structure including continuously stacked metal layers such as titanium (Ti)/aluminum (Al)/titanium (Ti).

In addition to the above-described embodiments, the type, structure, material, or the like of the sensor layer 150 may be variously changed. For example, the type, configuration, structure, shape, size, position, and/or material, or the like of the sensor electrodes TSE may be variously changed according to embodiments.

In case that the sensor layer 150, according to an embodiment, constitutes a touch sensor of a mutual capacitance method, one group of the sensor electrodes TSE among the first sensor electrodes TSE1 and the second sensor electrodes TSE2 may be the driving electrodes of the touch sensor, and the electrodes of the remaining group may be the sensing electrodes of the touch sensor. For example, the first sensor electrodes TSE1 may be the sensing electrodes of the touch sensor (e.g., electrodes Rx for sensing a voltage charged in mutual capacitance with the driving electrodes during a sensing period in which the touch sensor is activated), and the second sensor electrodes TSE2 may be the driving electrodes of the touch sensor (e.g., electrodes Tx to which a touch driving signal is applied from the touch driving circuit 400 during the sensing period in which the touch sensor is activated).

The active area AA may respond to a touch input through the sensor electrodes TSE. For example, when a touch input is disposed to the active area AA during a period in which the touch sensor is activated, sensing signals corresponding to the touch input may be outputted from the sensor electrodes TSE.

The wires TL may be electrically connected to each of the sensor electrodes TSE. For example, the wires TL may be electrically connected between each of the sensor electrodes TSE and each of the second pads TP. The sensor electrodes TSE and the wires TL may be electrically connected to the touch driving circuit 400 through each of the second pads TP.

In an embodiment, the wires TL may be electrically connected to each of the sensor electrodes TSE inside the active area AA or at the boundary between the active area AA and the non-active area NA. The wires TL may pass through the non-active area NA or the like and be electrically connected to each of the second pads TP disposed in the pad area PA.

The wires TL may include first wires TL1 electrically connected to each of the first sensor electrodes TSE1 and second wires TL2 electrically connected to each of the second sensor electrodes TSE2. In an embodiment, each of the first wires TL1 may sequentially pass through the first non-active area NA1 illustrated in FIG. 4 (e.g., the non-active area NA on the left side of the active area AA) or the third non-active area NA3 (e.g., the non-active area NA on the right side of the active area AA) and the second non-active area NA2 (e.g., the non-active area NA on the lower side of the active area AA) and be electrically connected to each of the second pads TP. In an embodiment, the second lines TL2 may pass through the second non-active area NA2 and be electrically connected to the second pads TP, respectively.

In an embodiment, at least one wire TL may pass proximate to the active area AA, and may pass through portions NA11, NA21, NA31, and N41 of the non-active area NA overlapping the opening OPN of the light blocker LBM. In this case, at least one wire TL might not be covered by the light blocker LBM and may be exposed to a visible area that a user may recognize. For example, in the second non-active area NA2 on the lower side of the active area AA, at least one wire TL may be exposed to a visible area according to an angle at which the user views the display panel 100 or the like, in the area NA21 overlapping the opening OPN of the light blocker LBM illustrated in FIG. 4 and/or at least a part of area C of FIG. 5 including the peripheral area of the area NA21. In embodiments, the wires TL are formed to prevent, reduce, or minimize the pattern see-through phenomenon of the wires TL that may be exposed in a visible area, such as area C of FIG. 5. A detailed description thereof will be given later.

Figure 6:
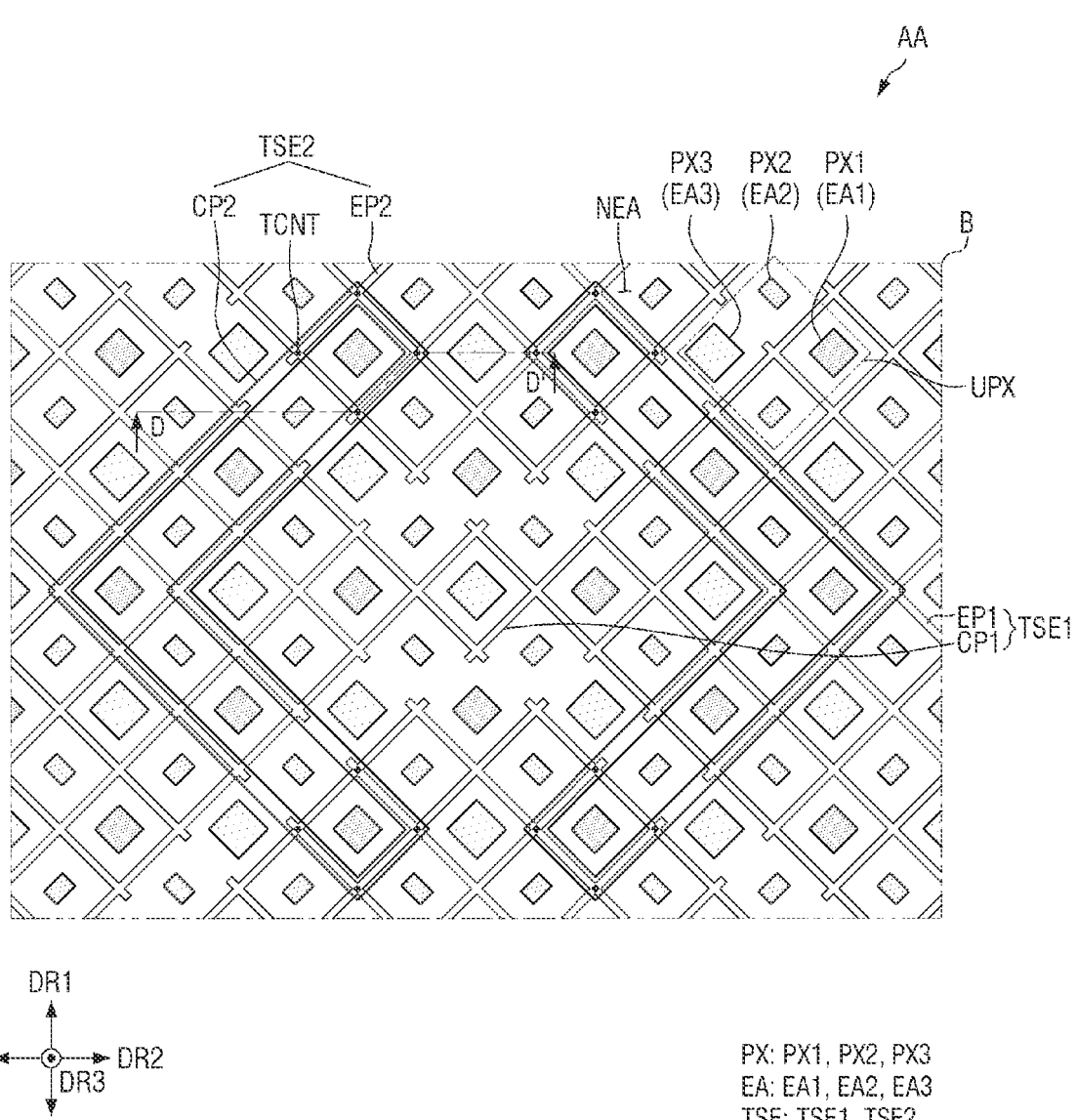
FIG. 6 is a plan view illustrating the active area according to an embodiment.

FIG. 6 is a plan view illustrating the active area AA according to an embodiment. For example, FIG. 6 illustrates a portion of the active area AA corresponding to portion B of FIG. 5.

Referring to FIG. 6 in addition to FIGS. 1 to 5, the pixels PX and the sensor electrodes TSE may be disposed in the active area AA. The pixels PX and the sensor electrodes TSE may be disposed in different layers in the display panel 100, and may or might not overlap each other. For example, the pixels PX may be disposed in the circuit layer 120 and the light emitting element layer 130 of the display panel 100. In one example, each pixel PX may include a pixel circuit including circuit elements disposed in the circuit layer 120 and a light emitting element disposed in the light emitting element layer 130. The sensor electrodes TSE may be disposed in the sensor layer 150 overlapping the circuit layer 120 and the light emitting element layer 130.

In an embodiment, the pixels PX may include the pixels PX of at least two colors. For example, the pixels PX may include first color pixels PX1 emitting light of a first color (e.g., red light), second color pixels PX2 emitting light of a second color (e.g., green light), and third color pixels PX3 emitting light of a third color (e.g., blue light). Each first color pixel PX1 may include a first emission area EA1, and may emit light of a first color (e.g., red light) from the first emission area EA1. Each second color pixel PX2 may include a second emission area EA2, and may emit light of a second color (e.g., green light) from the second emission area EA2. Each third color pixel PX3 may include a third emission area EA3, and may emit light of a third color (e.g., blue light) from the third emission area EA3. FIG. 5 illustrates the arrangement structure of the pixels PX based on an emission area EA of each of the pixels PX. The remaining area of the active area AA excluding the emission areas EA of the pixels PX may be a non-emission area NEA.

In an embodiment, the first color pixels PX1 and the third color pixels PX3 may be alternately arranged in the first direction DR1 and the second direction DR2. The second color pixels PX2 may be arranged side by side in the first direction DR1 and the second direction DR2, and may be adjacent to the first color pixels PX1 or the third color pixels PX3 in a diagonal direction intersecting the first direction DR1 and the second direction DR2.

Each of the emission areas EA of the first color pixels PX1, the second color pixels PX2, and/or the third color pixels PX3 may have a quadrilateral shape, such as a rhombus or rectangle. Alternatively, each of the emission areas EA of the first color pixels PX1, the second color pixels PX2, and/or the third color pixels PX3 may have a shape other than a quadrilateral shape.

In an embodiment, the first color pixels PX1, the second color pixels PX2, and/or the third color pixels PX3 may include emission areas EA having different sizes. For example, the first color pixels PX1, the second color pixels PX2, and the third color pixels PX3 may be formed to include emission areas EA having different sizes and/or proportions, depending on the light efficiency, lifetime, and/or white balance of the pixels PX.

At least one first color pixel PX1, at least one second color pixel PX2, and at least one third color pixel PX3 adjacent to each other may constitute a unit pixel UPX. In one example, one first color pixel PX1, two second color pixels PX2, and one third color pixel PX3 adjacent to each other may constitute one unit pixel UPX. Each unit pixel UPX may emit light of various colors, including white light, by color mixing of light emitted from the emission areas EA of the pixels PX constituting the unit pixel UPX.

The sensor electrodes TSE may be touch electrodes for detecting the user's touch or proximity and the like. In an embodiment, the sensor electrodes TSE may be disposed only in the active area AA corresponding to the display area, but is not necessarily limited thereto. For example, the sensor electrodes TSE may be disposed on at least a part of the display area and at least a part of the non-display area. The area in which the sensor electrodes TSE are disposed may be a sensing area and may generate sensing signals according to a touch input or the like.

In an embodiment, the sensor electrodes TSE may be formed in a mesh shaped pattern. For example, each of the first electrode portion EP1, the first connection portion CP1, the second electrode portion EP2, and/or the second connection portion CP2 may have a mesh shaped pattern including at least one opening. In an embodiment, the first electrode portions EP1, the second electrode portions EP2, the first connection portions CP1, and the second connection portions CP2 may include openings corresponding the emission areas EA of the pixels PX. Accordingly, the light loss of the display device 10 may be prevented or reduced, and the light efficiency may be increased.

In an embodiment, the first electrode portions EP1, the second electrode portions EP2, and the first connection portions CP1 may be disposed or disposed on the same layer in the sensor layer 150, and the second connection portion CP2 may be disposed on a different layer from the first electrode portions EP1, the second electrode portions EP2, and the first connection portions CP1 in the sensor layer 150. For example, the second connection portions CP2 may be electrically connected to each of the second electrode portions EP2 through each of contact portions TCNT including at least one contact hole.

The second connection portions CP2 may have a shape that is approximately bent one or more times. The second connection portions CP2 may have other shapes.

The display device 10 may include pixels PX and sensor electrodes TSE according to various embodiments other than the embodiment shown in FIG. 6. For example, the type, number, resolution, arrangement structure, shape, and/or size of the pixels PX, the type, number, and/or ratio of the pixels PX constituting each unit pixel UPX, and the like may be variously changed according to embodiments. In addition, the type, structure, shape, size, arrangement structure, and/or the like of the sensor electrodes TSE may be variously changed according to embodiments.

Figure 7:
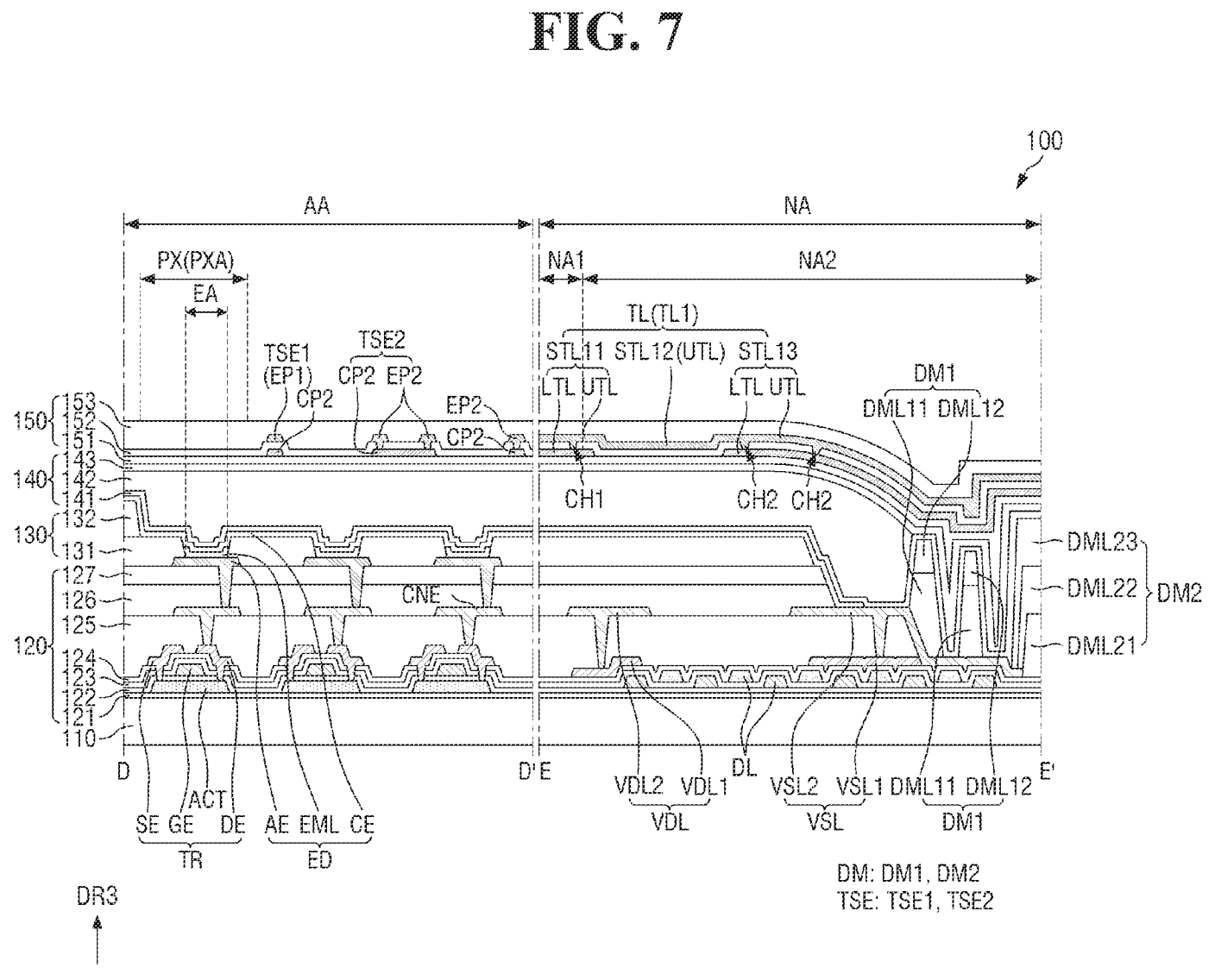

FIG. 7 is a cross-sectional view illustrating the display panel 100 according to an embodiment. For example, FIG. 7 illustrates a cross section of a part of each of the active area AA and the non-active area NA. In FIG. 7, the cross section with respect to the active area AA may be a cross section corresponding to a part of area B of FIG. 4, and may, for example, correspond to a cross section taken along line D-D' of FIG. 5, and a cross section with respect to the non-active area NA may correspond to a cross section taken along line E-E' of FIG. 4.

An additional layer may be disposed above the sensor layer 150. For example, the optical layer 160, the light blocker LBM, a passivation layer, and/or a window, or the like of FIG. 3 may be disposed above the sensor layer 150.

Referring to FIG. 7 in addition to FIGS. 1 to 6, the display panel 100 may include the substrate 110, and the circuit layer 120, the light emitting element layer 130, the encapsulation layer 140, and the sensor layer 150 disposed on the substrate 110. The circuit layer 120, the light emitting element layer 130, the encapsulation layer 140, and the sensor layer 150 may be sequentially arranged or stacked on the substrate 110 along the third direction DR3. First, the structure of the display panel 100 will be described, focusing on the active area AA.

The substrate 110 may be made of a material having a flexible characteristic capable of bending, folding, rolling, or the like. The substrate 110 may be formed of an insulating material such as a polymer resin. For example, the substrate 110 may be made of polyimide.

The circuit layer 120 may include the circuit elements constituting the pixel circuit of each pixel PX and the wirings. FIG. 6 illustrates one transistor TR of the circuit elements disposed in each pixel PX. The transistor TR may be disposed in a pixel region PXA of a corresponding pixel PX, and may be electrically connected to a light emitting element ED of the corresponding pixel PX. The transistor TR may include an active layer ACT, a gate electrode GE, a source electrode SE, and a drain electrode DE.

The circuit layer 120 may include electrically conductive layers for forming the circuit elements and the wirings, at least one semiconductor layer, and insulating layers disposed between the electrically conductive layers and the semiconductor layer. For example, the circuit layer 120 may include a first insulating layer 121 (e.g., buffer layer), a semiconductor layer (or first semiconductor layer), a second insulating layer 122 (e.g., first gate insulating layer), a first electrically conductive layer (e.g., first gate electrically conductive layer), a third insulating layer 123 (e.g., second gate insulating layer), a second electrically conductive layer (e.g., second gate electrically conductive layer), a fourth insulating layer 124 (e.g., interlayer insulating layer or first interlayer insulating layer), a third electrically conductive layer (e.g., first source-drain electrically conductive layer), a fifth insulating layer 125 (e.g., first via layer or first planarization layer), a fourth electrically conductive layer (e.g., second source-drain electrically conductive layer), a sixth insulating layer 126 (e.g., second via layer or second planarization layer), and a seventh insulating layer 127 (e.g., third via layer or third planarization layer), which are sequentially disposed on the substrate 110 along the third direction DR3.

The first insulating layer 121 may include at least one inorganic layer containing an inorganic insulating material (e.g., silicon nitride, silicon oxide, silicon oxynitride, titanium oxide, aluminum oxide, or another inorganic insulating material). However, embodiments are not necessarily limited thereto, and the material of the first insulating layer 121 may be changed.

In an embodiment, an additional electrically conductive layer may be disposed between the substrate 110 and the first insulating layer 121. For example, an electrically conductive layer including at least one wire (or a part of the at least one wire) and/or a bottom metal layer BML overlapping the active layer ACT of at least one transistor TR may be disposed between the substrate 110 and the first insulating layer 121.

The semiconductor layer may include the active layer ACT of each of the transistors TR. The semiconductor layer may include polycrystalline silicon, monocrystalline silicon, low-temperature polycrystalline silicon, amorphous silicon, or an oxide semiconductor material. Each active layer ACT may include a channel region, a source region, and a drain region.

The second insulating layer 122 may include at least one inorganic layer containing an inorganic insulating material. The material of the second insulating layer 122 may be changed according to embodiments.

The first electrically conductive layer may include the gate electrode GE of each of the transistors TR. Each gate electrode may include an electrically conductive material (e.g., at least one of molybdenum (Mo), aluminum (Al), chromium (Cr), gold (Au), titanium (Ti), nickel (Ni), neodymium (Nd), copper (Cu), or other metals, an alloy thereof, or other electrically conductive materials) and may be a single layer or multilayer electrode.

The first electrically conductive layer may further include at least one wire (or a part of the at least one wire) including an electrically conductive material, a bridge pattern, and/or a capacitor electrode. For example, the first electrically conductive layer may include a first group of data lines DL among the data lines DL electrically connected to the pixels PX. The data lines DL may extend from the sub-region SBA through the second non-active area NA2 to the active area AA, and may be alternately disposed on the first electrically conductive layer and the second electrically conductive layer in the second non-active area NA2. Accordingly, the data lines DL may be more densely arranged while ensuring insulation between the data lines DL. The data lines DL may be electrically connected to the pixels PX of the active area AA, and may supply data signals to the pixels PX, respectively.

The third insulating layer 123 may include at least one inorganic layer, including an inorganic insulating material. The material of the third insulating layer 123 may be changed according to embodiments.

The second electrically conductive layer may further include at least one wire (or a part of the at least one wire) including an electrically conductive material, a bridge pattern, and/or a capacitor electrode. For example, the second electrically conductive layer may include a second group of the data lines DL among the data lines DL electrically connected to the pixels PX. In an embodiment, when each pixel PX further includes at least one transistor formed on a different layer from the transistors TR shown in FIG. 7, the second electrically conductive layer may further include a bottom metal layer or a gate electrode of the at least one transistor.

The fourth insulating layer 124 may include at least one inorganic layer including an inorganic insulating material. The material of the fourth insulating layer 124 may be changed according to embodiments.

The third electrically conductive layer may include the source electrode SE and the drain electrode DE of each of the transistors TR. Each of the source electrode SE and drain electrode DE may include an electrically conductive material and may be a single layer or multilayer electrode. In an embodiment, the source electrode SE and the drain electrode DE of each of the transistors TR may be formed as the source region and the drain region of the active layer ACT, and the third electrically conductive layer may include a bridge pattern electrically connected to the source electrode SE or the drain electrode DE of at least one transistor TR, or the like.

The third electrically conductive layer may further include at least one wire (or a part of the at least one wire) including an electrically conductive material, a bridge pattern, and/or a capacitor electrode. For example, the third electrically conductive layer may include a first wiring layer VDL1 of the first power line VDL and a first wiring layer VSL1 of the second power line VSL. The first power line VDL may extend from the sub-region SBA through the second non-active area NA2 or the like to the active area AA. The first power line VDL may be electrically connected to the pixels PX of the active area AA, and may supply the first power voltage (e.g., a high-potential pixel driving voltage) to the pixels PX. The second power line VSL may extend from the sub-region SBA through the second non-active area NA2 or the like to the active area AA. The second power line VSL may be electrically connected to the pixels PX of the active area AA, and may supply the second power voltage (e.g., a low-potential pixel driving voltage) to the pixels PX.

The fifth insulating layer 125 may include at least one organic layer containing an organic insulating material (e.g., acrylic resin, epoxy resin, phenolic resin, polyamide resin, polyimide resin, or another organic insulating material) to planarize the circuit layer 120. The organic insulating material constituting the fifth insulating layer 125 may be variously changed according to embodiments.

The fourth electrically conductive layer may include connection electrodes CNE (or connection lines) respectively connecting the transistors TR to the light emitting elements ED. The connection electrodes CNE may be respectively disposed on the transistors TR and may each electrically connect the transistor TR to the light emitting element ED of the corresponding pixel PX. Each of the connection electrodes CNE may include an electrically conductive material and may be a single layer or multilayer electrode.

The fourth electrically conductive layer may further include at least one wire (or a part of the at least one wire) including an electrically conductive material, and/or a bridge pattern. For example, the fourth electrically conductive layer may include a second wiring layer VDL2 of the first power line VDL and a second wiring layer VSL2 of the second power line VSL.

Each of the sixth insulating layer 126 and the seventh insulating layer 127 may include at least one organic layer containing an organic insulating material (e.g., the organic insulating material exemplified as the material of the fifth insulating layer 125 or another organic insulating material) to planarize the circuit layer 120. The organic insulating material constituting the sixth insulating layer 126 and the seventh insulating layer 127 may be variously changed according to embodiments. In an embodiment, the sixth insulating layer 126 and the seventh insulating layer 127 may be integrated into a single insulating layer.

The light emitting element layer 130 may include the light emitting elements ED located in the emission areas EA. The light emitting element layer 130 may further include a pixel defining layer 131 that partitions the emission areas EA, and a spacer 132 disposed on a part of the pixel defining layer 131.

The light emitting elements ED may be electrically connected to the transistors TR through the connection electrode CNE or the like, respectively. Each light emitting element ED may include a first electrode AE (e.g., anode electrode) electrically connected to the connection electrode CNE and/or the transistor TR, and a light emitting layer EML and a second electrode CE (e.g., cathode electrode) sequentially disposed on the first electrode AE.

The first electrode AE of the light emitting element ED may include an electrically conductive material and may be disposed on the circuit layer 120. For example, the first electrode AE may be disposed on the seventh insulating layer 127 to correspond to each emission area EA. In an embodiment, the first electrode AE may include a metallic material having high reflectivity. For example, the first electrode AE may have a single-layer structure of molybdenum (Mo), titanium (Ti), copper (Cu) or aluminum (Al), or may have a multilayer structure (e.g., ITO/Mg, ITO/MgF, ITO/Ag, and ITO/Ag/ITO) including indium-tin-oxide (ITO), indium-zinc-oxide (IZO), zinc oxide (ZnO), indium oxide ($In_2O_3$) and silver (Ag), magnesium (Mg), aluminum (Al), platinum (Pt), lead (Pb), gold (Au), or nickel (Ni).

The light emitting layer EML of the light emitting element ED may include a high molecular material or a low molecular material. Light emitted from the light emitting layer EML may contribute to image display. In an embodiment, the light emitting layer EML may be disposed for each pixel PX, and the light emitting layer EML of each pixel PX may emit visible light of a color corresponding to the corresponding pixel PX. In an embodiment, the light emitting layer EML may be a common layer shared by pixels PX of different colors, and a wavelength conversion layer and/or color filters corresponding to the color (or wavelength band) of light desired to be emitted from each pixel PX may be arranged in the emission areas EA of at least some of the pixels PX.

The second electrode CE of the light emitting element ED may include an electrically conductive material and may be electrically connected to the second power line VSL. In an embodiment, the second electrode CE may be a common layer formed across the entire active area AA to cover the light emitting layer EML and the pixel defining layer 131. In an embodiment, the second electrode CE may be formed of a transparent conductive material (TCO) such as ITO or IZO capable of transmitting light or a semi-transmissive electrically conductive material such as magnesium (Mg), silver (Ag), or an alloy of magnesium (Mg) and silver (Ag). When the second electrode CE is made of a semi-transmissive electrically conductive material, an improvement in light output efficiency due to a micro cavity effect may be expected.

The pixel defining layer 131 may have an opening corresponding to each of the emission areas EA and may surround the emission areas EA. For example, the pixel defining layer 131 may be formed to cover the edge of the first electrode AE of each of the light emitting elements ED and may include an opening that exposes the remaining part of the first electrode AE. A region where the exposed first electrode AE and the light emitting layer EML overlap (or a region including the same) may be defined as the emission area EA of each pixel PX.

The pixel defining layer 131 may include at least one organic layer containing an organic insulating material. In an embodiment, the pixel defining layer 131 may include an organic insulating material selected from the group consisting of acrylic resin, epoxy resin, phenolic resin, polyamide resin, polyimide resin, unsaturated polyester resin, polyphenylene ether resin, polyphenylenesulfide resin and benzocyclobutene (BCB). The organic insulating material constituting the pixel defining layer 131 is not particularly limited and may be variously changed according to embodiments.

The spacer 132 may be disposed on a part of the pixel defining layer 131. For example, the spacer 132 may be regularly or irregularly distributed in the non-emission area NEA.

The spacer 132 may include at least one organic layer containing an organic insulating material. The spacer 132 may include the same material as the pixel defining layer 131 or may include a different material from the pixel defining layer 131. In an embodiment, the pixel defining layer 131 and the spacer 132 may be sequentially formed through separate mask processes. In an embodiment, the pixel defining layer 131 and the spacer 132 may be simultaneously formed using a halftone mask. In this case, the pixel defining layer 131 and the spacer 132 may be regarded as a single insulating layer that is integral with each other. The organic insulating material constituting the spacer 132 is not particularly limited thereto and may be variously changed according to embodiments.

The encapsulation layer 140 may be disposed on the light emitting element layer 130 in the active area AA and the non-active area NA proximate to the active area AA. The encapsulation layer 140 may block the permeation of oxygen or moisture into the light emitting element layer 130, and may reduce electrical or physical impacts to the circuit layer 120 and the light emitting element layer 130.

In an embodiment, the encapsulation layer 140 may include a first encapsulation layer 141, a second encapsulation layer 142, and a third encapsulation layer 143 sequentially disposed on the light emitting element layer 130. The first encapsulation layer 141 and the third encapsulation layer 143 may include an inorganic insulating material, and the second encapsulation layer 142 may include an organic insulating material.

In an embodiment, the second encapsulation layer 142 may be prepared by dropping an organic material in a liquid state onto the first encapsulation layer 141, spreading it to cover the active area AA, and then curing it. In addition, the display panel 100 may include at least one dam DM for limiting the diffusion range of the organic material of the second encapsulation layer 142. The dam DM may be disposed in the non-active area NA adjacent to the active area AA to surround the active area AA. For example, the dam DM may be disposed in a part of the non-active area NA and overlapping the light blocker LBM of FIG. 4.

The second encapsulation layer 142 may extend to an area where the at least one dam DM is disposed. Accordingly, the first encapsulation layer 141 and the third encapsulation layer 143 may be bonded at the periphery of the dam DM.

At least one dam DM may be disposed in the non-active area NA. The dam DM may surround the active area AA in plan view. For example, at least one first dam DM1 and at least one second dam DM2 sequentially surrounding the active area AA may be disposed in the non-active area NA. A bank or the like may be disposed in the sub-region SBA disposed outside the second dam DM2.

Each dam DM may be simultaneously formed using the same material as at least one organic layer located in the active area AA. For example, each dam DM may be simultaneously formed using the same material as at least one organic layer of the fifth insulating layer 125, the sixth insulating layer 126, the seventh insulating layer 127, the pixel defining layer 131, or the spacer 132.

In an embodiment, the first dam DM1 may be a double structure or a multi-structure dam. For example, two or more first dams DM1 may surround the active area AA.

Each first dam DM1 may include at least one organic layer. In an embodiment, each first dam DM1 may have a multilayer structure with at least two organic layers stacked. In an embodiment, each first dam DM1 may include a first dam layer DML11 and a second dam layer DML12 disposed on the first dam layer DML11. For example, the first dam layer DML11 may include the same material as the sixth insulating layer 126 or the seventh insulating layer 127 and may be formed in substantially the same layer as the sixth insulating layer 126 or the seventh insulating layer 127. In this case, the first dam layer DML11 may be considered as a part of the sixth insulating layer 126 or the seventh insulating layer 127. The second dam layer DML12 may include the same material as the pixel defining layer 131 or the spacer 132 and may be formed in substantially the same layer as the pixel defining layer 131 or the spacer 132. In this case, the second dam layer DML12 may be considered as a part of the pixel defining layer 131 or the spacer 132.

The second dam DM2 may include at least one organic layer. In an embodiment, the second dam DM2 may have a multilayer structure with at least two organic layers stacked. For example, the second dam DM2 may include a first dam layer DML21, a second dam layer DML22 disposed on the first dam layer DML21, and a third dam layer DML23 disposed on the second dam layer DML22. The first dam layer DML21 may include the same material as the fifth insulating layer 125 and may be formed in substantially the same layer as the fifth insulating layer 125. In this case, the first dam layer DML21 may be considered as a part of the fifth insulating layer 125. The second dam layer DML22 may include the same material as the sixth insulating layer 126 or the seventh insulating layer 127 and may be formed in substantially the same layer as the sixth insulating layer 126 or the seventh insulating layer 127. In this case, the second dam layer DML22 may be considered as a part of the sixth insulating layer 126 or the seventh insulating layer 127. The third dam layer DML23 may include the same material as the pixel defining layer 131 or the spacer 132 and may be formed in substantially the same layer as the pixel defining layer 131 or the spacer 132. In this case, the third dam layer DML23 may be considered as a part of the pixel defining layer 131 or the spacer 132.

Since at least one dam DM is spaced apart from the active area AA, a valley may be formed between a dam area where the at least one dam DM is formed and the active area AA and between adjacent dams DM. The valley may limit an area in which the second encapsulation layer 142 diffuses. The first encapsulation layer 141 and the third encapsulation layer 143 may end at a portion (e.g., the first edge area BEA1) of the bank area BNKA of FIGS. 4 and 5.

The sensor layer 150 may be disposed on the encapsulation layer 140. The sensor layer 150 may include the sensor electrodes TSE and at least one insulating layer. For example, the sensor layer 150 may include a buffer layer 151 disposed on the encapsulation layer 140, the second connection portions CP2 disposed on the buffer layer 151, an insulating layer 152 (e.g., an interlayer insulating layer of the sensor layer 150) disposed on the second connection portions CP2, the first electrode cells EP1, the first connection portions CP1, and the second electrode cells EP2 disposed on the insulating layer 152, and an overcoat layer 153 disposed on the first electrode cells EP1, the first connection portions CP1, and the second electrode cells EP2. In an embodiment, the first electrode cells EP1, the first connection portions CP1, and the second electrode cells EP2 may be disposed on the buffer layer 151, and the second connection portions CP2 may be disposed on the insulating layer 152 covering the first electrode cells EP1, the first connection portions CP1, and the second electrode cells EP2. In addition, positions of the first electrode cells EP1, the first connection portions CP1, the second electrode cells EP2, and the second connection portions CP2 may be changed according to an embodiment. For example, the first electrode cells EP1 and the second electrode cells EP2 may be disposed on different layers with the insulating layer 152 interposed therebetween, and the first connection portions CP1 and the second connection portions CP2 may be integrally formed with the first electrode cells EP1 and the second electrode cells EP2, respectively.

Each of the buffer layer 151 and the insulating layer 152 may include at least one inorganic layer including an inorganic insulating material.

The overcoat layer 153 may be made of an organic insulating material that can be disposed in a low-temperature process. For example, the overcoat layer 153 may be made of a negative photoresist material.

The first electrode cells EP1, the first connection portions CP1, the second electrode cells EP2, and the second connection portions CP2 may include an electrically conductive material and may be formed of a single layer or multiple layers, respectively.

The sensor electrodes TSE may be electrically connected to the respective wires TL. For example, the first sensor electrodes TSE1 including the first electrode cells EP1 and the first connection portions CP1 may be electrically connected to the first wires TL1, respectively, and the second sensor electrodes TSE2 including the second electrode cells EP2 and the second connection portions CP2 may be electrically connected to the respective second wires TL2, respectively.

In an embodiment, the wires TL may be formed simultaneously with the sensor electrodes TSE. For example, each of the wires TL may include a first wiring layer LTL (e.g., lower wiring layer) disposed on the buffer layer 151 and formed simultaneously with the second connection portions CP2 (or the first electrode cells EP1, the first connection portions CP1, and the second electrode cells EP2), and a second wiring layer UTL (e.g., an upper wiring layer) disposed on the insulating layer 152 and formed simultaneously with the first electrode cells EP1, the first connection portions CP1, and the second electrode cells EP2 (or the second connection portions CP2).

In an embodiment, at least one wire TL may include only a single wiring layer (e.g., the first wiring layer LTL or the second wiring layer UTL) in a portion of the second non-active area NA2. The at least one wire TL may include at least two wiring layers in at least one portion among the remaining portions (e.g., double-layered wiring layers including the first wiring layer LTL and the second wiring layer UTL, or triple- or more layered wiring layers including an additional wiring layer in addition to the first wiring layer LTL and the second wiring layer UTL).

For example, at least one first wire TL1 passing through the first non-active area NA1 (or the third non-active area NA3) and the second non-active area NA2 may include a double-layered first wiring portion STL11 (also referred to as a "first sub-wire") disposed in the first non-active area NA1 (or the third non-active area NA3) and including the first wiring layer LTL and the second wiring layer UTL, a second wiring portion STL12 (also referred to as a "second sub-wire") disposed in one portion of the second non-active area NA2 and including only a single wiring layer (e.g., the first wiring layer LTL or the second wiring layer UTL), and a double-layered third wiring portion STL13 (also referred to as a "third sub-wire") disposed in another portion of the second non-active area NA2 and including the first wiring layer LTL and the second wiring layer UTL. For example, in forming at least one first wire TL1 passing through the second non-active area NA2, the second wiring portion STL12 may be formed to include a single wiring layer by removing the first wiring layer LTL or the second wiring layer UTL in the second wiring portion STL12 of the at least one first wire TL1. The second wiring portion SPL2 may be disposed in an area corresponding to a visible area or disposed proximate to a visible area, such as area E of FIG. 5, and may be a portion extending from the second non-display area NA2 in the second direction DR2. The first wiring layer LTL and the second wiring layer UTL of the first wiring portion STL11 may be electrically connected to each other through at least one first contact hole CH1 penetrating the insulating layer 152. The first wiring layer LTL and the second wiring layer UTL of the third wiring portion STL13 may be electrically connected to each other through at least one second contact hole CH2 penetrating the insulating layer 152.

Figure 8:
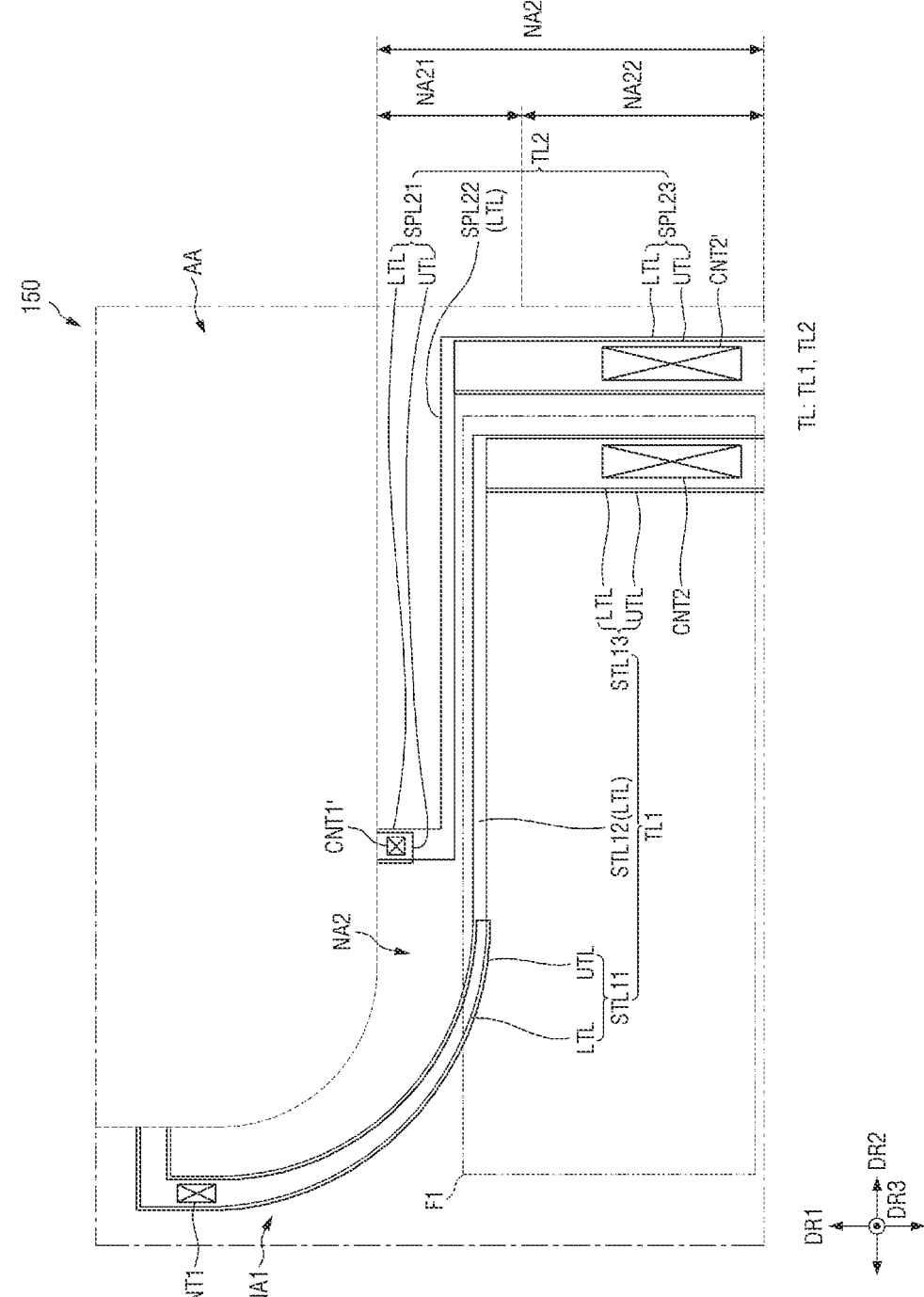
FIG. 8 is a plan view showing a part of the sensor layer according to an embodiment.

FIG. 8 is a plan view showing a part of the sensor layer 150 according to an embodiment. For example, in representing the wires TL passing through the non-active area NA of the sensor layer 150, FIG. 8 schematically illustrates one first wire TL1 passing through the first non-active area NA1 and the second non-active area NA2 and one second wire TL2 passing through the second non-active area NA2.

Referring to FIG. 8 in addition to FIGS. 1 to 7, the first wire TL1 may include the first wiring portion STL11, the second wiring portion STL12, and the third wiring portion STL13 sequentially electrically connected from one end disposed at the boundary between the active area AA and the non-active area NA.

The first wiring portion STL11 of the first wire TL1 may be a portion electrically connected to one first sensor electrode TSE1 disposed in the active area AA. For example, one end of the first wiring portion STL11 may extend into the active area AA and be electrically connected to one first sensor electrode TSE1, or may be electrically connected to one first sensor electrode TSE1 at the boundary between the active area AA and the non-active area NA. The other end of the first wiring portion STL11 may be electrically connected to the second wiring portion STL12.

At least a part of the first wiring portion STL11 of the first wire TL1 may extend in the first direction DR1. For example, the first wiring portion STL11 may be disposed in the first non-active area NA1, and at least a part thereof may extend in the first direction DR1 in the first non-active area NA1. In an embodiment, the first wiring portion STL11 may extend into the second non-active area NA2 to be electrically connected to the second wiring portion STL12.

In an embodiment, the first wiring portion STL11 of the first wire TL1 may include at least two wiring layers. For example, the first wiring portion STL11 may include the first wiring layer LTL and the second wiring layer UTL overlapping each other with the insulating layer 152 interposed therebetween. The first wiring layer LTL and the second wiring layer UTL of the first wiring portion STL11 may be electrically connected to each other through a first contact portion CNT1 including at least one first contact hole CH1.

In the first wiring portion STL11 of the first wire TL1, the first wiring layer LTL and the second wiring layer UTL may have substantially the same or similar widths, and may generally and/or substantially overlap. For example, the first wiring layer LTL and the second wiring layer UTL of the first wiring portion STL11 may completely overlap each other or may partially non-overlap at the edge or the like due to a process error (e.g., an alignment error within a predetermined range) or the like that may occur within a predetermined tolerance error range.

The second wiring portion STL12 of the first wire TL1 may be electrically connected to the first wiring portion STL11 and may be disposed in the second non-active area NA2. The second wiring portion STL12 may extend in the second direction DR2 crossing the first direction DR1. For example, the second wiring portion STL12 may be a portion in which the first wire TL1 extends in the second direction DR2 in the second non-active area NA2. For example, when viewed on a plane defined by the first direction DR1 and the second direction DR2, the second wiring portion STL12 may extend parallel to the lower edge of the active area AA.

In an embodiment, when viewed on a plane defined by the first direction DR1 and the second direction DR2, the second wiring portion STL12 of the first wire TL1 may be disposed proximate to the lower edge of the active area AA. For example, the second wiring portion STL12 may be disposed in a portion (e.g., one portion NA21 of the second non-active area NA2, which is not covered by the light blocker LBM) of the non-active area NA overlapping the opening OPN of the light blocker LBM illustrated in FIG. 4. Alternatively, the second wiring portion STL12 may be disposed in a portion (e.g., a portion disposed proximate to the opening OPN of the light blocker LBM in one portion NA22 of the second non-active area NA2 covered by the light blocker LBM) of the non-active area NA immediately adjacent to the opening OPN of the light blocker LBM illustrated in FIG. 4.

In an embodiment, the second wiring portion STL12 of the first wire TL1 may include a single wiring layer. For example, the second wiring portion STL12 may include only the first wiring layer LTL. In an embodiment, the first wiring layer LTL of the second wiring portion STL12 may be disposed on the same layer as the first wiring layer LTL of the first wiring portion STL11 and the first wiring layer LTL of the third wiring portion STL13. For example, the first wiring layer LTL of the second wiring portion STL12 may be integrally formed with the first wiring layer LTL of the first wiring portion STL11 and the first wiring layer LTL of the third wiring portion STL13. In an embodiment, the second wiring portion STL12 may include only the second wiring layer integrally formed with the second wiring layer UTL of the first wiring portion STL11 and the second wiring layer UTL of the third wiring portion STL13.

The third wiring portion STL13 of the first wire TL1 may be electrically connected to the second wiring portion STL12 and may be disposed in the second non-active area NA2. The third wiring portion STL13 may extend from one end of the second wiring portion STL12 in the first direction DR1 in the second non-active area NA2. For example, the third wiring portion STL13 may be a portion in which the first wire TL1 extends in the first direction DR1 in the second non-active area NA2.

In an embodiment, the third wiring portion STL13 of the first wire TL1 may include at least two wiring layers. For example, the third wiring portion STL13 may include the first wiring layer LTL and the second wiring layer UTL overlapping each other with the insulating layer 152 interposed therebetween. The first wiring layer LTL and the second wiring layer UTL of the first wiring portion STL11 may be electrically connected to each other through a second contact portion CNT2 including at least one second contact hole CH2.

In the third wiring portion STL13 of the first wire TL1, the first wiring layer LTL and the second wiring layer UTL may have substantially the same or similar widths, and may generally and/or substantially overlap. For example, the first wiring layer LTL and the second wiring layer UTL of the third wiring portion STL13 may completely overlap each other or may partially non-overlap at the edge or the like due to a process error or the like that may occur within a predetermined tolerance error range.

Although FIG. 8 illustrates the structure of the first wire TL1 passing through the first non-active area NA1 and the second non-active area NA2, the structure of the first wire TL1 passing through the third non-active area NA3 and the second non-active area NA2 may also be substantially the same as or similar to the above-described structure. For example, in FIG. 5, the first wire TL1 passing through the second non-active area NA2 via the third non-active area NA3 disposed on the right side of the active area AA may include the first wiring portion STL11 disposed in at least the third non-active area NA3, the second wiring portion STL12 including a single wiring layer and extending in the second direction DR2 from the second non-active area NA2, and the third wiring portion STL13 extending in the first direction DR1 in the second non-active area NA2.

The second wire TL2 may include the first wiring portion STL21, the second wiring portion STL22, and the third wiring portion STL23 sequentially electrically connected from one end disposed at the boundary between the active area AA and the non-active area NA.

The first wiring portion STL21 of the second wire TL2 may be a portion electrically connected to one second sensor electrode TSE2 disposed in the active area AA. For example, one end of the first wiring portion STL21 may extend into the active area AA and be electrically connected to one second sensor electrode TSE2 or may be electrically connected to one second sensor electrode TSE2 at the boundary between the active area AA and the non-active area NA. The other end of the first wiring portion STL21 may be electrically connected to the second wiring portion STL22.

At least a part of the first wiring portion STL21 of the second wire TL2 may extend in the first direction DR1. For example, the first wiring portion STL21 may be disposed in the second non-active area NA2 and may extend in the first direction DR1. The first wiring portion STL21 may extend to the second wiring portion STL22 in the second non-active area NA2.

In an embodiment, the first wiring portion STL21 of the second wire TL2 may include at least two wiring layers. For example, the first wiring portion STL21 may include the first wiring layer LTL and the second wiring layer UTL overlapping each other with the insulating layer 152 interposed therebetween. The first wiring layer LTL and the second wiring layer UTL of the first wiring portion STL21 may be electrically connected to each other through a first contact portion CNT1' including at least one contact hole.

In the first wiring portion STL21 of the second wire TL2, the first wiring layer LTL and the second wiring layer UTL may generally and/or substantially overlap. For example, the first wiring layer LTL and the second wiring layer UTL of the first wiring portion STL21 may completely overlap each other or may partially non-overlap at the edge or the like due to a process error or the like that may occur within a predetermined tolerance error range.

The second wiring portion STL22 of the second wire TL2 may extend from one end of the first wiring portion STL21 in the second direction DR2 in the second non-active area NA2. For example, the second wiring portion STL22 may be a portion in which the second wire TL2 extends in the second direction DR2 in the second non-active area NA2. For example, when viewed on a plane defined by the first direction DR1 and the second direction DR2, the second wiring portion STL22 may extend parallel to the lower edge of the active area AA.

In an embodiment, when viewed on a plane defined by the first direction DR1 and the second direction DR2, the second wiring portion STL22 of the second wire TL2 may be disposed proximate to the lower edge of the active area AA. For example, the second wiring portion STL22 may be disposed in a portion (e.g., one portion NA21 of the second non-active area NA2, which is not covered by the light blocker LBM) of the non-active area NA overlapping the opening OPN of the light blocker LBM illustrated in FIG. 4.

In an embodiment, the second wiring portion STL22 of the second wire TL2 may include a single wiring layer. For example, the second wiring portion STL22 may include only the first wiring layer LTL. In an embodiment, the first wiring layer LTL of the second wiring portion STL22 may be disposed on the same layer as the first wiring layer LTL of the first wiring portion STL21 and the first wiring layer LTL of the third wiring portion STL23. For example, the first wiring layer LTL of the second wiring portion STL22 may be integrally formed with the first wiring layer LTL of the first wiring portion STL21 and the first wiring layer LTL of the third wiring portion STL23.

The third wiring portion STL23 of the second wire TL2 may extend from one end of the second wiring portion STL22 in the first direction DR1 in the second non-active area NA2. For example, the third wiring portion STL23 may be a portion in which the second wire TL2 extends in the first direction DR1 in the second non-active area NA2 and extends to the sub-region SBA.

In an embodiment, the third wiring portion STL23 of the second wire TL2 may include at least two wiring layers. For example, the third wiring portion STL23 may include the first wiring layer LTL and the second wiring layer UTL overlapping each other with the insulating layer 152 interposed therebetween. The first wiring layer LTL and the second wiring layer UTL of the third wiring portion STL23 may be electrically connected to each other through a second contact portion CNT2' including at least one second contact hole CH2.

In the third wiring portion STL23 of the second wire TL2, the first wiring layer LTL and the second wiring layer UTL may have substantially the same or similar widths, and may generally and/or substantially overlap. For example, the first wiring layer LTL and the second wiring layer UTL of the third wiring portion STL23 may completely overlap each other or may partially non-overlap at the edge or the like due to a process error or the like that may occur within a predetermined tolerance error range.

Figure 9:
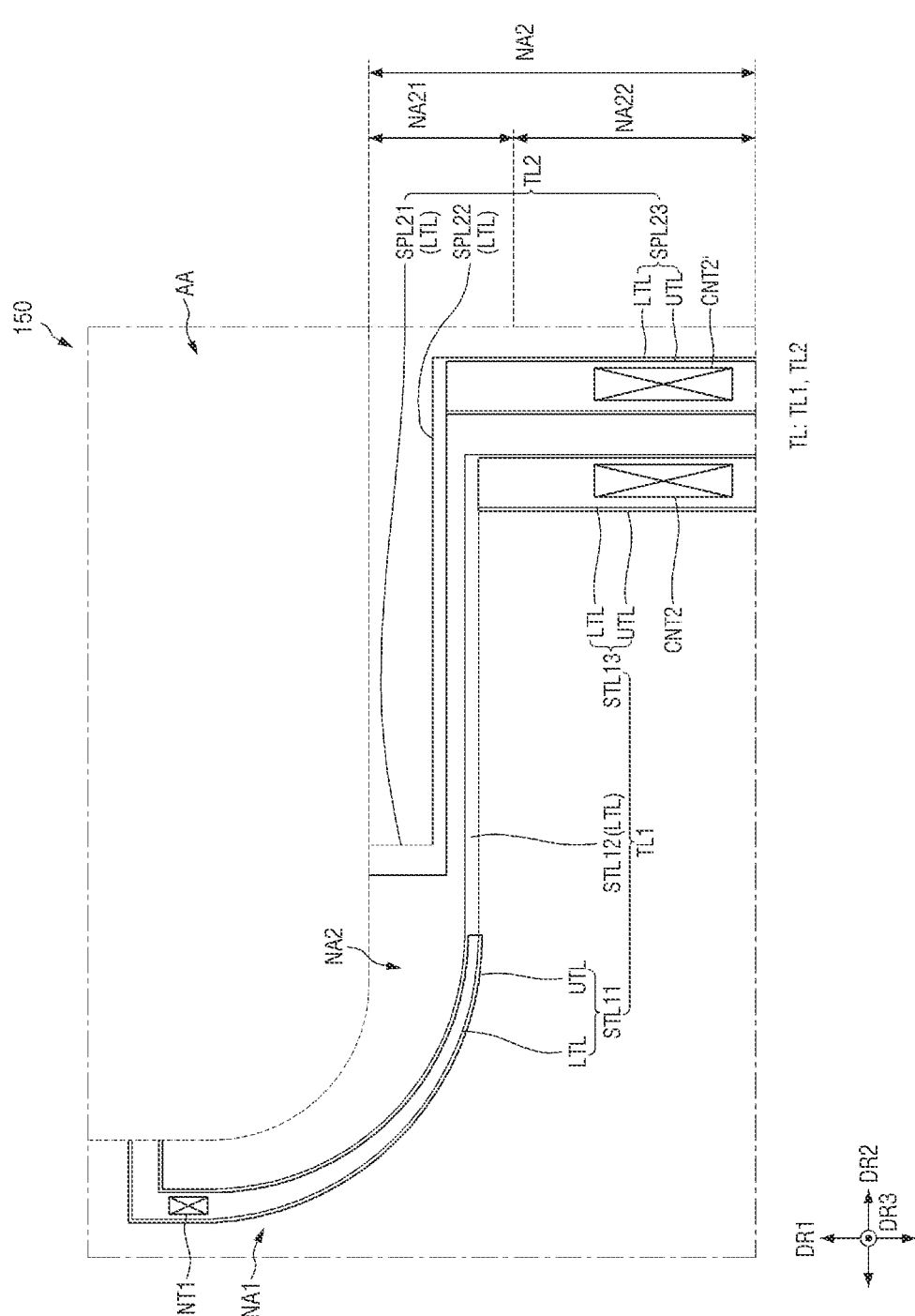
FIG. 9 is a plan view showing a part of the sensor layer according to an embodiment.

FIG. 9 is a plan view showing a part of the sensor layer 150 according to an embodiment. For example, FIG. 9 illustrates a modified embodiment of the embodiment of FIG. 8 in relation to the second wire TL2.

Referring to FIG. 9 in addition to FIGS. 1 to 8, the first wiring portion STL21 of the second wire TL2 may include a single wiring layer. For example, the first wiring portion STL21 may include the single first wiring layer LTL similar to the second wiring portion STL22 and may be integrally formed with the second wiring portion STL22.

Figure 10:
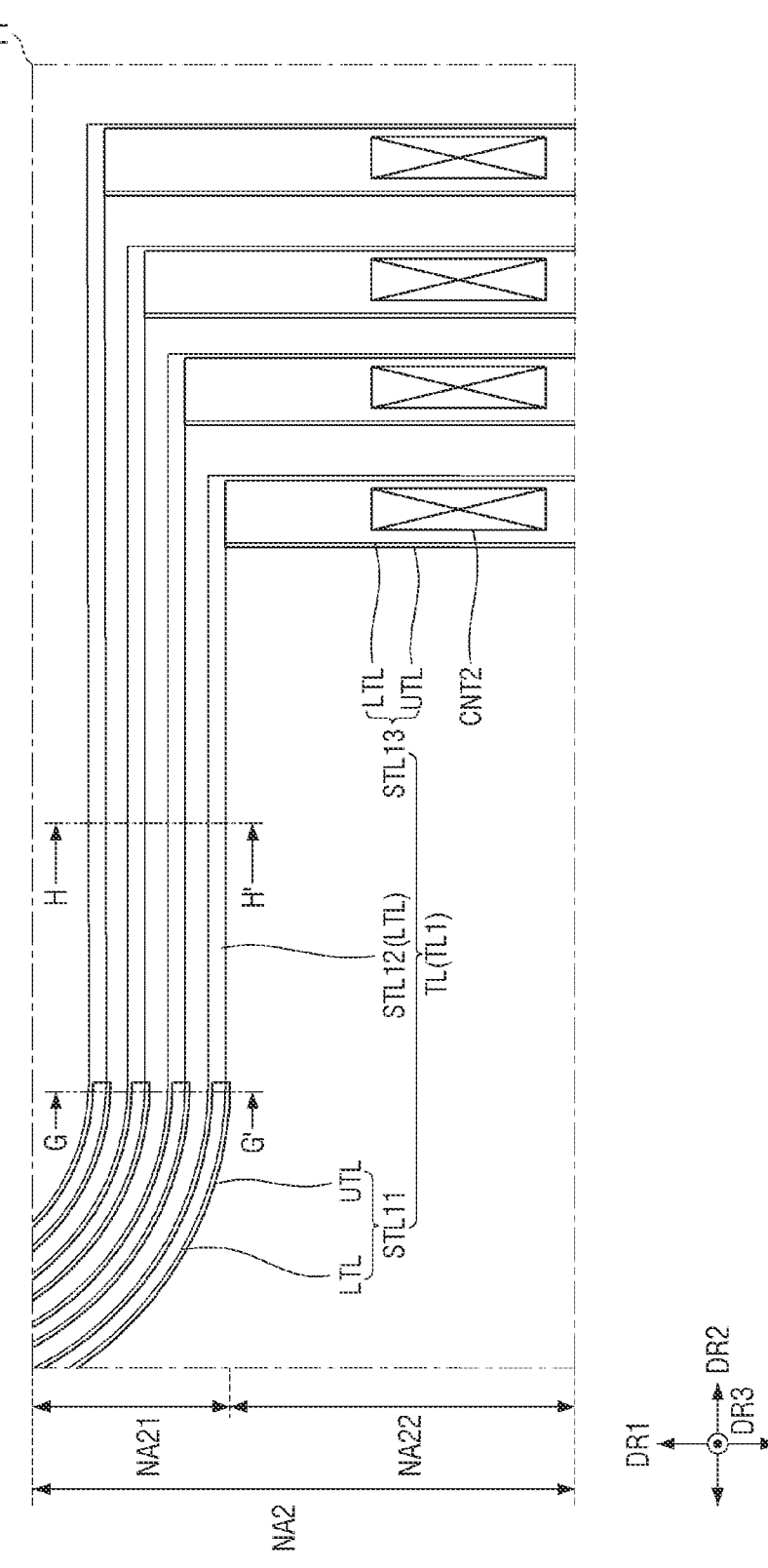
FIG. 10 is a plan view illustrating an embodiment of the wirings that may be disposed in area F1 of FIG. 8.

FIG. 10 is a plan view illustrating an embodiment of the wires TL that may be disposed in area F1 of FIG. 8. For example, FIG. 10 illustrates the first wires TL1 that may be disposed in area F1 of FIG. 8.

Figure 11:
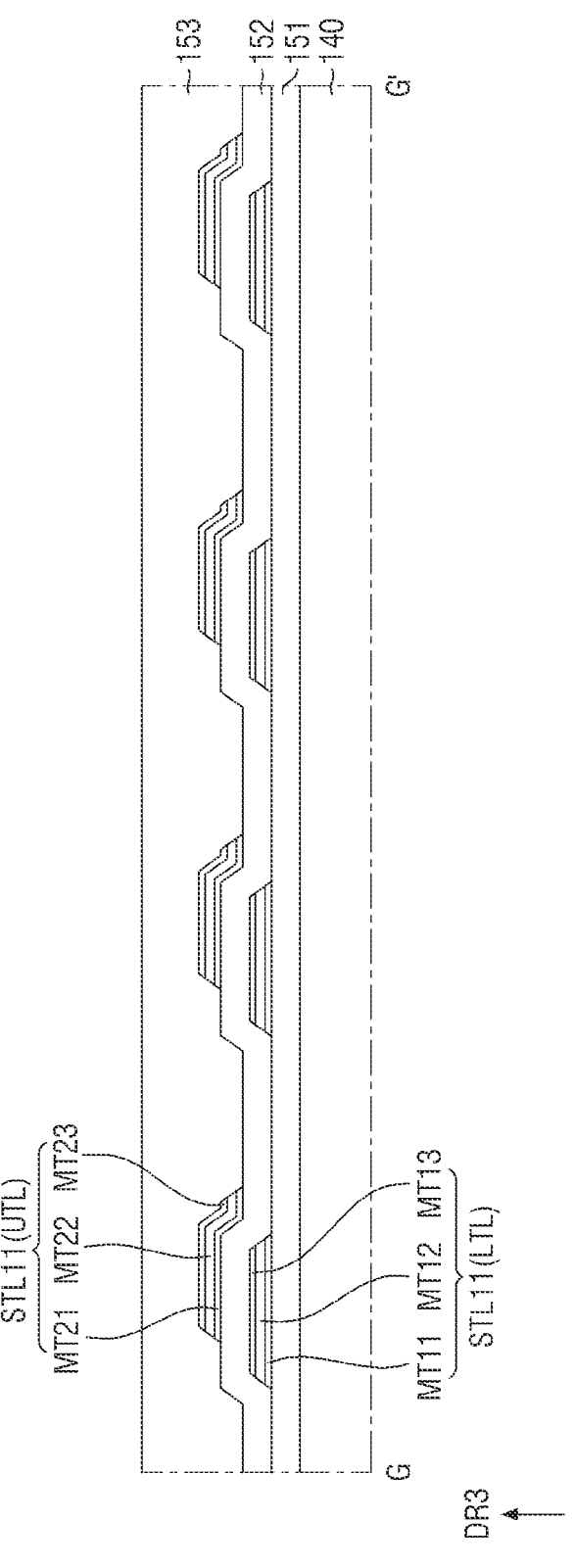
FIG. 11 is a cross-sectional view illustrating an embodiment of a cross section corresponding to line G-G' of FIG. 10.

FIG. 11 is a cross-sectional view illustrating an embodiment of a cross section corresponding to line G-G' of FIG.

Figure 12:
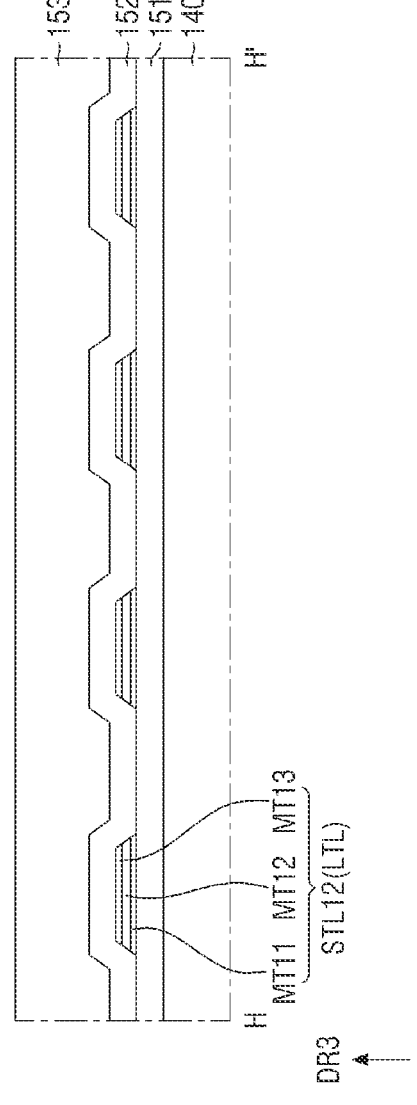
FIG. 12 is a cross-sectional view illustrating an embodiment of a cross section corresponding to line H-H' of FIG. 10.

10. FIG. 12 is a cross-sectional view illustrating an embodiment of a cross section corresponding to line H-H' of FIG. 10.

Referring to FIGS. 10 to 12 in addition to FIGS. 1 to 9, a plurality of wires TL including at least two first wires TL1 may pass through one portion NA21 of the second non-active area NA2, which is not covered by the light blocker LBM. The plurality of wires TL may include each of the first wiring portions STL11 including at least two wiring layers (e.g., the first wiring layer LTL and the second wiring layer UTL), each of the second wiring portions STL12 including a single wiring layer (e.g., the first wiring layer LTL), and each of the third wiring portions STL13 including at least two wiring layers (e.g., the first wiring layer LTL and the second wiring layer UTL).

In an embodiment, each wiring layer may have a multi-layer structure. For example, each of the first wiring layer LTL and the second wiring layer UTL may have a multilayer structure including first metal layers MT11 and MT21 including a first metal, second metal layers MT12 and MT22 disposed on the first metal layer MT11 and MT21 and including a second metal, and third metal layers MT13 and MT23 disposed on the second metal layers MT12 and MT22 and including a third metal. In an embodiment, the first metal and the third metal may have a light reflectivity smaller than that of the second metal and may be made of the same material. For example, each of the first wiring layer LTL and the second wiring layer UTL may have a triple-layered structure of titanium (Ti)/aluminum (Al)/titanium (Ti) in which the first metal layers MT11 and MT21 including titanium (Ti), the second metal layers MT12 and MT22 including aluminum (Al), and the third metal layers MT13 and MT23 including titanium (Ti) are continuously stacked.

Figure 13:
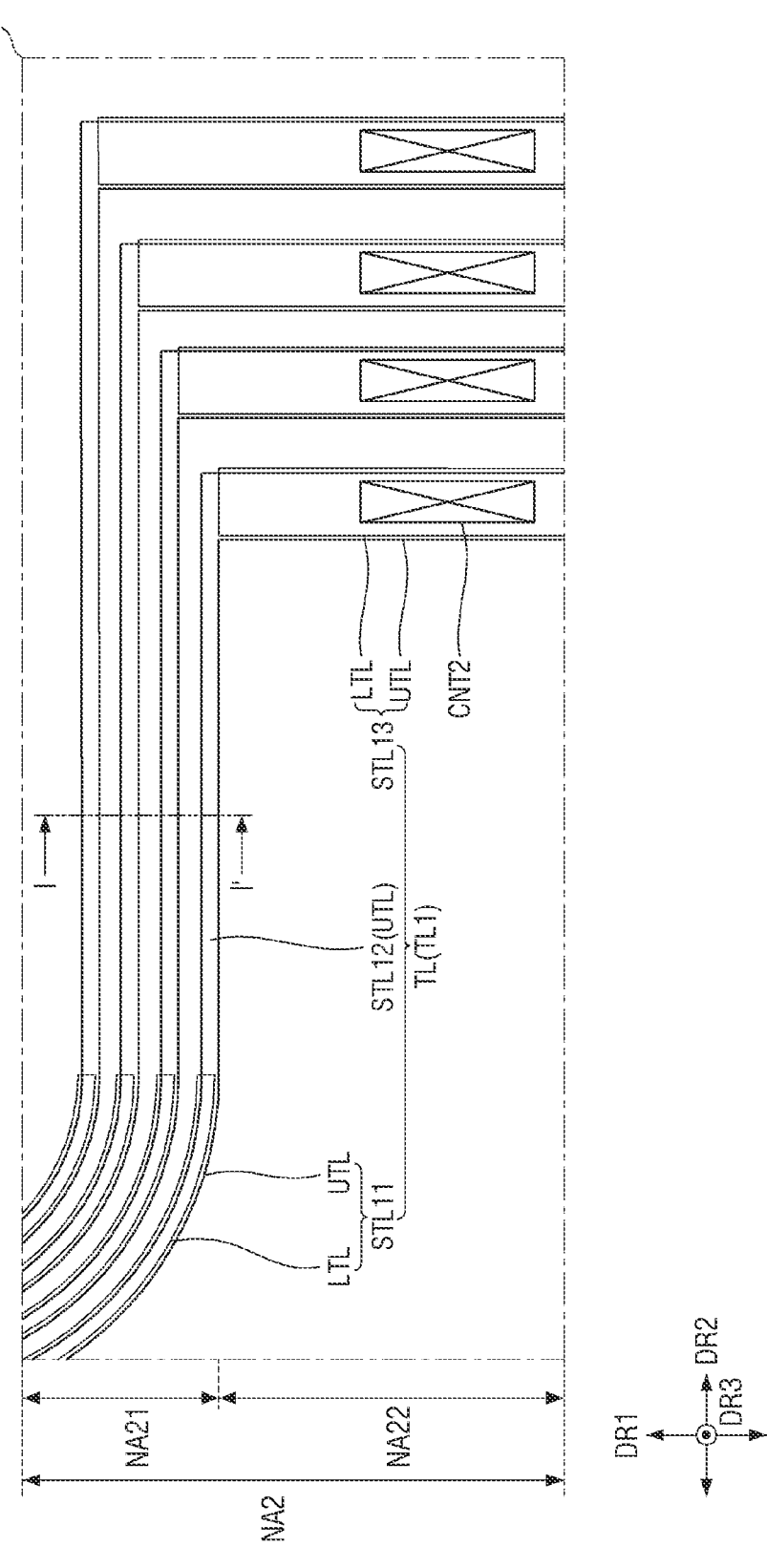
FIG. 13 is a plan view illustrating an embodiment of the wirings that may be disposed in area F1 of FIG. 8.

FIG. 13 is a plan view illustrating an embodiment of the wires TL that may be disposed in area F1 of FIG. 8. For example, FIG. 10 illustrates a modified embodiment of the embodiment of FIG. 10 in relation to the second wiring portions STL12 of the first wires TL1 that may be disposed in area F1 of FIG. 8.

Figure 14:
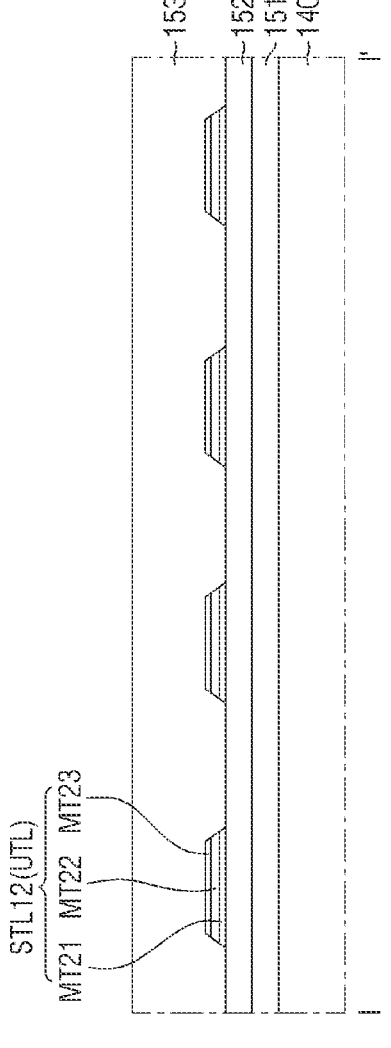
FIG. 14 is a cross-sectional view illustrating an embodiment of a cross section corresponding to line I-I' of FIG. 13.
Figure 14:

FIG. 14 is a cross-sectional view illustrating an embodiment of a cross section corresponding to line I-I' of FIG. 13.

Referring to FIGS. 13 and 14 in addition to FIGS. 1 to 12, the plurality of wires TL passing through the second non-active area NA2, for example, the first wires TL1 passing through one portion NA21 of the second non-active area NA2 that is not covered by the light blocker LBM may include the second wiring portions STL12 including the single second wiring layer UTL. In an embodiment, the second wiring portion STL12 of each of the first wires TL1 may be disposed on the same layer as the second wiring layer UTL of the first wiring portion STL11 and the second wiring layer UTL of the third wiring portion STL13 constituting the same first wire TL1, and they may be integrally formed with each other.

In an embodiment, the second wires TL2 disclosed in FIG. 5 may also include the second wiring portions STL22 including the single second wiring layer UTL, similarly to the first wires TL1. In addition, the second wiring portion STL22 of each of the second wires TL2 may be disposed on the same layer as the second wiring layer UTL of the first wiring portion STL21 and the second wiring layer UTL of the third wiring portion STL23 constituting the same second wire TL2, and they may be integrally formed with each other.

According to the above-described embodiments, the second wiring portions STL12 and STL22 of the wire TL extending in the second direction DR2 may be formed as a single wiring layer in a visible area that may be exposed to the user's field of view (e.g., an area that corresponds to the opening OPN of the light blocker LBM and an area that is not covered by the light blocker LBM) and/or an area disposed proximate to the visible area (e.g., an area likely to be visually recognized by a user according to an angle at which the display device 10 is viewed or the like). Accordingly, it is possible to prevent, reduce, or minimize the pattern see-through phenomenon of the wire TL.

For example, unlike in the above-described embodiments, when the second wiring portions STL12 and STL22 extending in the second direction DR2 in the second non-display area NA2 is formed in a double-layered structure including the first wiring layer LTL and the second wiring layer UTL like the first wiring portions STL11 and STL21 and the third wiring portions STL13 and STL23 or the like, an edge portion including one side surface of the first wiring layer LTL may be exposed when an alignment error occurs in the first direction DR1. For example, depending on an angle at which the user views the display device 10, an edge portion including one side surface of the second metal layer MT12 of the first wiring layer LTL in the first direction DR1 might not be covered by at least one of the first metal layers MT11 and MT21 or the third metal layers MT13 and MT23 of the first wiring layer LTL and the second wiring layer UTL and may be exposed.

In an embodiment, the material included in the second metal layers MT12 and MT22 of the first wiring layer LTL and the second wiring layer UTL may be different from the material included in the first metal layers MT11 and MT21 and the third metal layers MT13 and MT23 of the first wiring layer LTL and the second wiring layer UTL. Due to a difference in light reflectivity (or amount of light reflection) between the material included in the second metal layers MT12 and MT22 and the material included in the first metal layers MT11 and MT21 and the third metal layers MT13 and MT23, a pattern see-through phenomenon in which the pattern of the wire TL is visually recognized by the user may occur.

For example, the second metal layer MT12 of the first wiring layer LTL may be formed of a material (e.g., aluminum (Al) having a UV reflectivity of approximately 87%) having a light reflectivity greater than that of a material (e.g., titanium (Ti) having a UV reflectivity of approximately 5% to 6%) constituting the first metal layers MT11 and MT21 and the third metal layers MT13 and MT23 of the first wiring layer LTL and the second wiring layer UTL. Accordingly, when the second metal layers MT21 and MT22 of the first wiring layer LTL and the second wiring layer UTL are exposed at the same edge of the wire TL, a pattern see-through phenomenon in which the pattern of the wire TL is visually recognized by a user may occur.

For example, in the same form as the first wiring portion STL11 illustrated in FIGS. 10 and 11, when the second wiring portion STL12 has a double-layered structure and one side surface (e.g., the left edge portion of FIG. 11) of the first wiring layer LTL is exposed, all of the side surface of the second metal layer MT12 of the first wiring layer LTL and the side surface of the second metal layer MT22 of the second wiring layer UTL may be exposed in and proximate to the exposed side surface, and thus the light amount of reflected light reflected from the second wiring portion STL12 may be relatively large. Accordingly, a pattern see-through phenomenon of the wires TL may occur.

In the above-described embodiments, in an area (e.g., the area NA21 that is not covered by the light blocker LBM in the second non-display area NA2 and/or the immediate peripheral area thereof) in which the pattern see-through phenomenon of the wires TL may occur, the second wiring portions STL12 and STL22 of the wires TL extending in the second direction DR2 may be formed as a single wiring layer, so that the light amount of reflected light that may be reflected from the wires TL may be reduced or minimized. Accordingly, although an alignment error or the like occurs in the process of forming the wires TL including the first wiring layer LTL and the second wiring layer UTL, the second wiring portions STL12 and STL22 that may be exposed to a user may be formed as a single wiring layer, so that the light amount of reflected light may be reduced or minimized. Accordingly, it is possible to prevent, reduce, or minimize the pattern see-through phenomenon of the wires TL.

Figure 15:
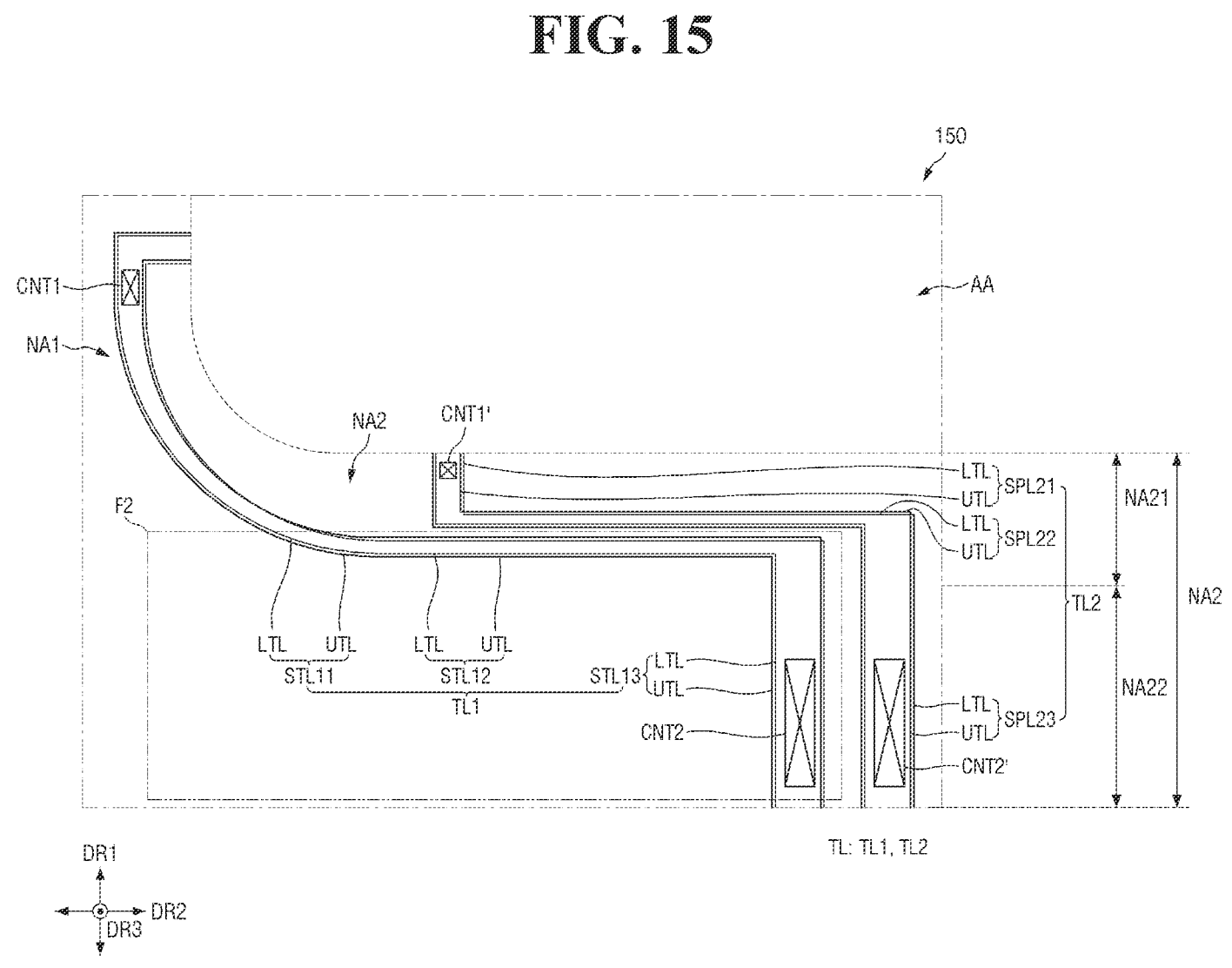

FIG. 15 is a plan view showing a part of the sensor layer 150 according to an embodiment. For example, FIG. 15 illustrates a modified embodiment of the embodiment of FIG. 8 in relation to the structures of the first wire TL1 and the second wire TL2.

Figure 16:
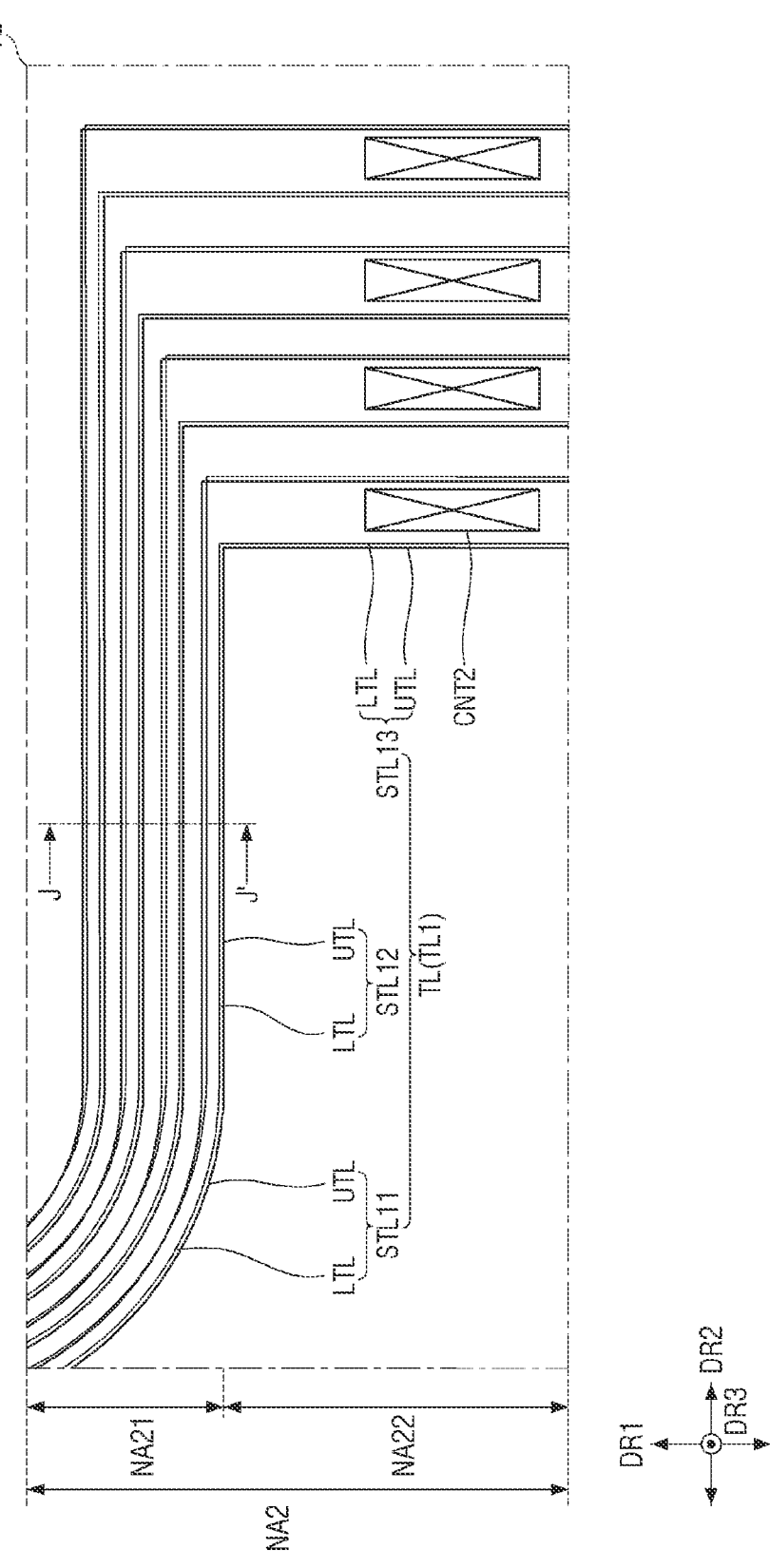
FIG. 16 is a plan view illustrating an embodiment of the wirings that may be disposed in area F2 of FIG. 15.

FIG. 16 is a plan view illustrating an embodiment of the wires TL that may be disposed in area F2 of FIG. 15. For example, FIG. 16 illustrates a modified embodiment of the embodiment of FIG. 10 in relation to the structure of the first wires TL1 that may be disposed in area F2 of FIG. 15.

Figure 17:
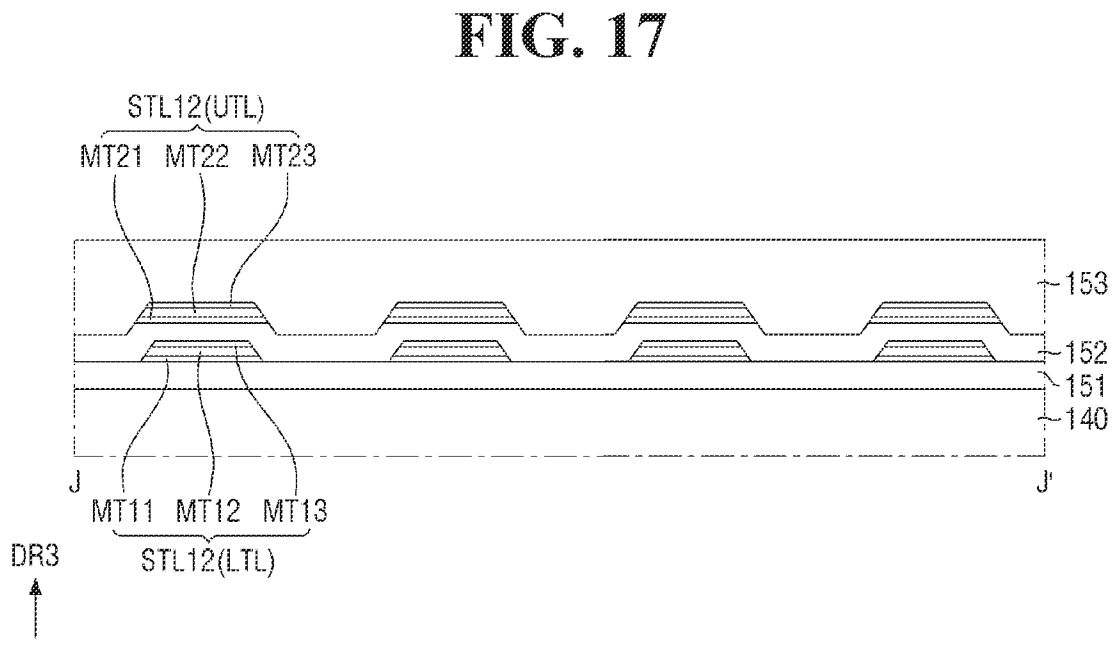
Figure 18:
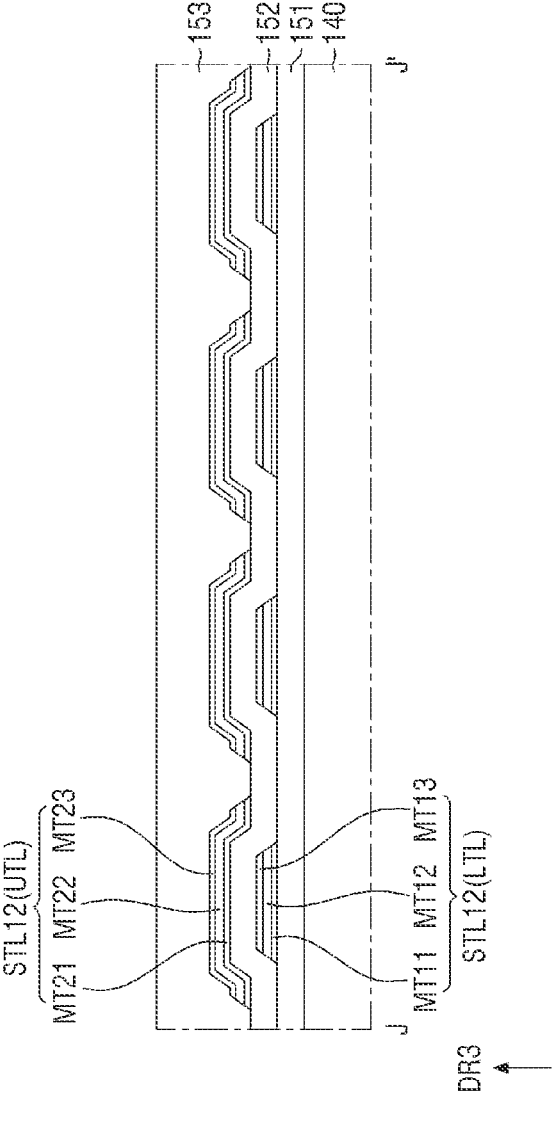
FIG. 18 is a cross-sectional view illustrating an embodiment of a cross section corresponding to line J-J' of FIG. 16.

FIG. 17 is a cross-sectional view illustrating an embodiment of a cross section corresponding to line J-J' of FIG. 16. FIG. 18 is a cross-sectional view illustrating an embodiment of a cross section corresponding to line J-J' of FIG. 16. For example, FIGS. 17 to 18 illustrate different embodiments of a cross section corresponding to line J-J' of FIG. 16.

Referring to FIGS. 15 to 18 in addition to FIGS. 1 to 14, the second wiring portion STL12 of the first wire TL1 may include at least two wiring layers. For example, the second wiring portion STL12 of the first wire TL1 may include the first wiring layer LTL and the second wiring layer UTL. The first wiring layer LTL of the second wiring portion STL12 may extend in the second direction DR2 in the non-active area NA (e.g., the second non-active area NA2). The second wiring layer UTL of the second wiring portion STL12 may be disposed on the insulating layer 152 covering the first wiring layer LTL and may extend in the second direction DR2 in the non-active area NA (e.g., the second non-active area NA2) and overlapping the first wiring layer LTL of the second wiring portion STL12.

In the second wiring portion STL12, the second wiring layer UTL may have a greater width than the first wiring layer LTL and may cover a top surface of the first wiring layer LTL. For example, the second wiring layer UTL may be formed to have a larger width than the first wiring layer LTL by expanding the width of the second wiring layer UTL, reducing the width of the first wiring layer LTL, or expanding the width of the second wiring layer UTL and reducing the width of the first wiring layer LTL. In an embodiment, when viewed on a plane defined by the first direction DR1 and the second direction DR2, at least one of the first metal layer MT21 or the third metal layer MT23 of the second wiring layer UTL may completely cover the second metal layer MT12 of the first wiring layer LTL.

For example, as illustrated in FIG. 17, the bottom surface of the second wiring layer UTL corresponding to the bottom surface of the third metal layer MT23 may cover the second metal layer MT12 and the third metal layer MT13 of the first wiring layer LTL while having a larger width than at least the second metal layer MT12 and the third metal layer MT13 of the first wiring layer LTL.

In an embodiment, as illustrated in FIG. 18, the second wiring layer UTL may be expanded to have a larger width sufficient to cover portions corresponding to the top surface and side surface of the first wiring layer LTL.

Each of the first wiring portion STL11 and the third wiring portion STL13 of the first wire TL1 may have a single-layer or multilayer structure. For example, each of the first wiring portion STL11 and the third wiring portion STL13 of the first wire TL1 may include the first wiring layer LTL and the second wiring layer UTL. In an embodiment, the first wiring layer LTL of each of the first wiring portion STL11 and the third wiring portion STL13 may be integral with the first wiring layer LTL of the second wiring portion STL12. In an embodiment, the second wiring layer UTL of each of the first wiring portion STL11 and the third wiring portion STL13 may be disposed on the insulating layer 152 and overlapping the first wiring layer LTL of the first wiring portion STL11 and the third wiring portion STL13 and may be integral with the second wiring layer UTL of the second wiring portion STL12.

The second wiring portion STL22 of the second wire TL2 may include at least two wiring layers. For example, the second wiring portion STL22 of the second wire TL2 may include the first wiring layer LTL and the second wiring layer UTL. The first wiring layer LTL of the second wiring portion STL22 may extend in the second direction DR2 in the non-active area NA (e.g., the second non-active area NA2). The second wiring layer UTL of the second wiring portion STL22 may be disposed on the insulating layer 152 covering the first wiring layer LTL and may extend in the second direction DR2 in the non-active area NA (e.g., the second non-active area NA2) and overlapping the first wiring layer LTL of the second wiring portion STL22.

In the second wiring portion STL22, the second wiring layer UTL may have a greater width than the first wiring layer LTL and may cover (e.g., completely cover) a top surface of the first wiring layer LTL. For example, in the second wiring portion STL22, the second wiring layer UTL may be formed with a width sufficient to cover the first wiring layer LTL in consideration of a process error range such as an alignment error that may occur in the manufacturing process of the display device 10.

In an embodiment, the first wiring layer LTL of the second wire TL2, like the first wiring layer LTL of the first wire TL1, may have a multilayer structure including the first metal layer MT11, the second metal layer MT12, and the third metal layer MT13, and the second wiring layer UTL of the second wire TL2, like the second wiring layer UTL of the first wire TL1, may have a multilayer structure including the first metal layer MT21, the second metal layer MT22, and the third metal layer MT23. When viewed on a plane defined by the first direction DR1 and the second direction DR2, at least one of the first metal layer MT21 or the third metal layer MT23 included in the second wiring layer UTL of the second wire TL2 may completely cover the second metal layer MT23 included in the first wiring layer LTL of the second wire TL2.

According to the above-described embodiment, in the visible area exposed to the user's field of view and/or in the area disposed proximate to the visible area, the second wiring portions STL12 and STL22 of the wire TL extending in the second direction DR2 may be formed to have a double- or more layered structure including the first wiring layer LTL and the second wiring layer UTL but may be formed such that the second wiring layer UTL covers the top surface of the first wiring layer LTL. For example, in the visible area or the like, the second metal layers MT12 and MT22 of the first wiring layer LTL may be completely covered by the first metal layer MT21 and/or the third metal layer MT23 of the second wiring layer UTL. Accordingly, the light amount of reflected light that may be reflected from the second wiring portions STL12 and STL22 that may be exposed to a user may be reduced or minimized, and the pattern see-through of the wires TL may be prevented, reduced, or minimized.

Figure 19:
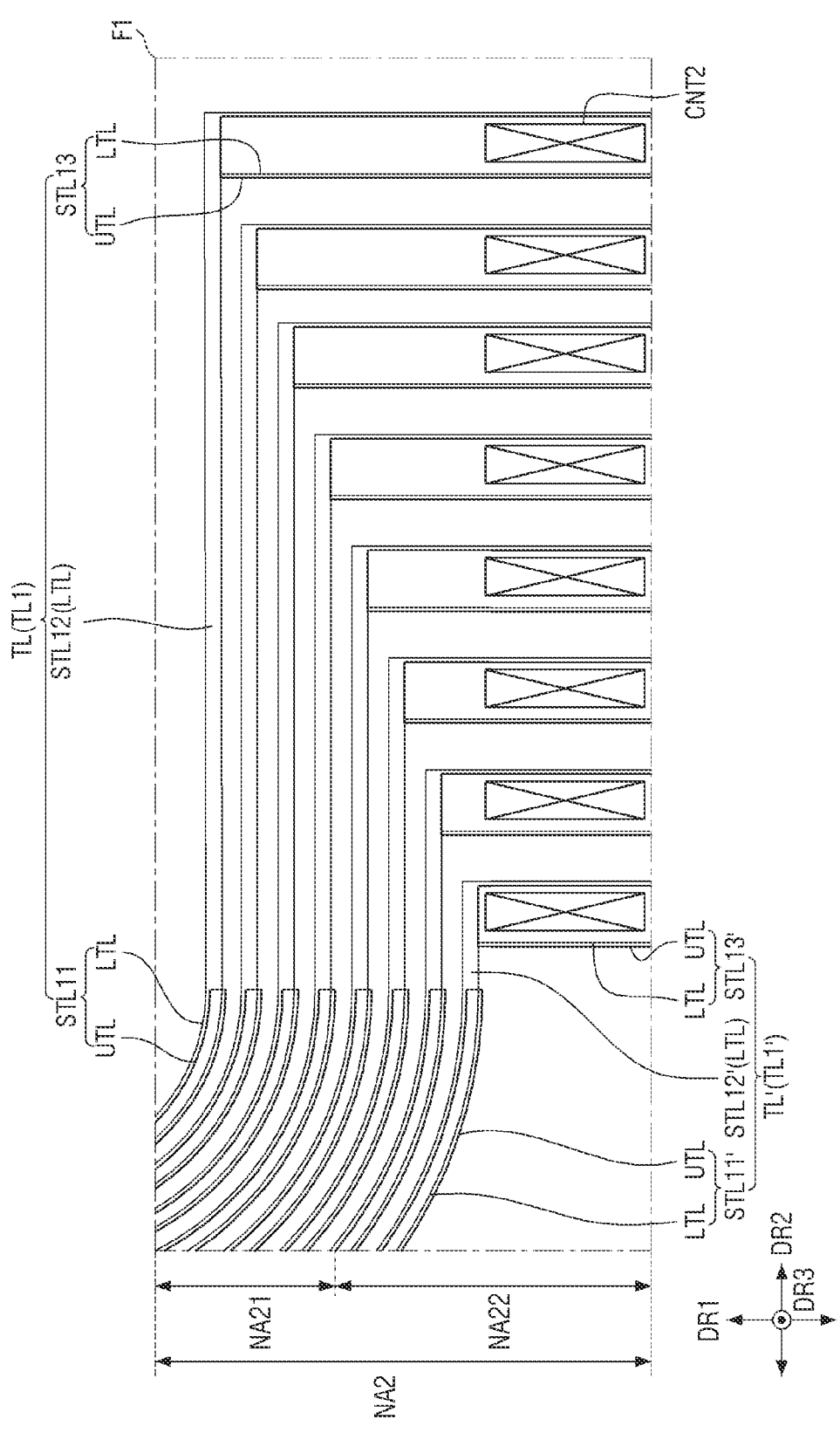
FIG. 19 is a plan view illustrating an embodiment of the wirings that may be disposed in area F1 of FIG. 8.

FIG. 19 is a plan view illustrating an embodiment of the wire TL and a wire TL' that may be disposed in area F1 of FIG. 8. For example, FIG. 19 illustrates a further embodiment in relation to the embodiment of FIG. 10.

Referring to FIG. 19 in addition to FIGS. 1 to 18, a plurality of wires TL' (e.g., first wires TL1' overlapping the light blocker LBM in the second non-active area NA2) may be also disposed in one portion NA22 of the second non-active area NA2 covered by the light blocker LBM. In an embodiment, at least some of the plurality of wires TL' may have substantially the same or similar structures as the wires TL disposed in one portion NA21 of the second non-active area NA2 that is not covered by the light blocker LBM. For example, in the wires TL and TL' passing through the second non-active area NA2 regardless of whether the wires TL and TL' overlap the light blocker LBM, each of the second wiring portions STL12 and STL12' extending in the second direction DR2 in the second non-active area NA2 may have substantially the same cross-sectional structure.

In an embodiment, the wires TL and TL' passing through the second non-active area NA2 may include a single wiring layer in each of the second wiring portions STL12 and STL12', and the single wiring layer may be the first wiring layer LTL. However, embodiments are not necessarily limited thereto. For example, as in the embodiments of FIGS. 13 and 14, the wires TL and TL' passing through the second non-active area NA2 may include a single wiring layer in each of the second wiring portions STL12 and STL12', and the single wiring layer may be the second wiring layer UTL. Alternatively, as in the embodiments of FIGS. 17 and 18, the wires TL and TL' passing through the second non-active area NA2 may include the first wiring layer LTL and the second wiring layer UTL in each of the second wiring portions STL12 and STL12', and the second wiring layer UTL may completely cover the top surface of the first wiring layer LTL while having a larger width than the first wiring layer LTL.

The first wiring portions STL11' and the third wiring portions STL13' of the wires TL' including each of the second wiring portions STL12' disposed in one portion NA22 of the second non-active area NA2 covered by the light blocker LBM may have substantially the same or similar structures as the first wiring portions STL11' and the third wiring portions STL13' of the wires TL including each of the second wiring portions STL12 disposed in one portion NA21 of the second non-active area NA2 that is not covered by the light blocker LBM. For example, regardless of whether the wires TL and TL' overlap the light blocker LBM, the wires TL and TL' may include each of the first wiring portions STL11 and STL11' and the third wiring portions STL13 and STL13' including the first wiring layer LTL and the second wiring layer UTL having substantially the same or similar widths.

Figure 20:
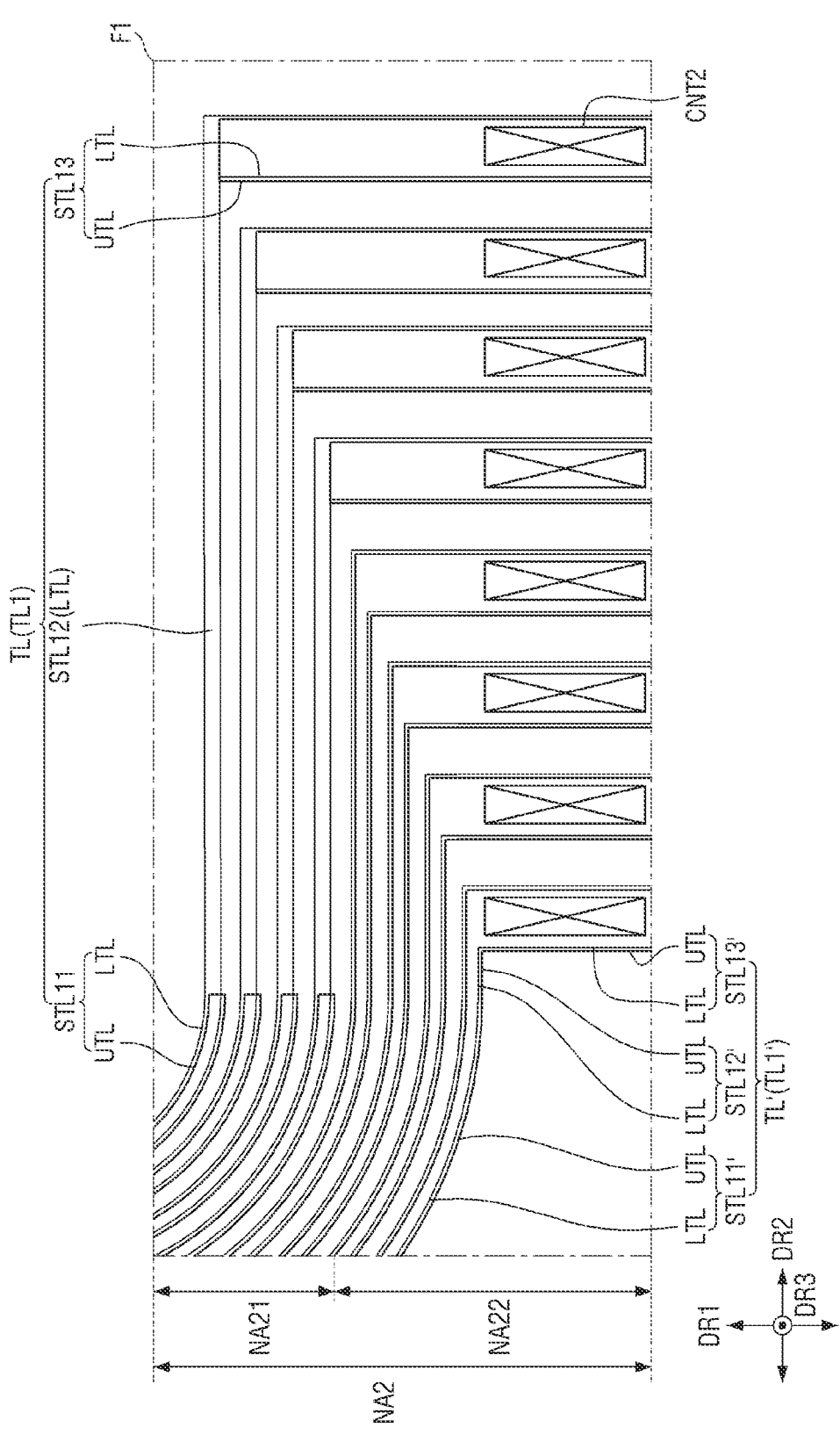
FIG. 20 is a plan view illustrating an embodiment of the wirings that may be disposed in area F1 of FIG. 8.

FIG. 20 is a plan view illustrating an embodiment of the wires TL that may be disposed in area F1 of FIG. 8. For example, FIG. 20 illustrates a modified embodiment of the embodiment of FIG. 19.

Referring to FIG. 20 in addition to FIGS. 1 to 19, the wires TL disposed in one portion NA21 of the second non-active area NA2 that is not covered by the light blocker LBM and the wires TL' disposed in one portion NA22 of the second non-active area NA2 covered by the light blocker LBM may include the second wiring portions STL12 and STL12' having different structures. For example, the wires TL' passing through one portion NA22 of the second non-active area NA2 covered by the light blocker LBM may include at least two wiring layers including the first wiring layer LTL and the second wiring layer UTL, and the first wiring layer LTL may have substantially the same or similar width as the second wiring layer UTL. The first wiring layer LTL and the second wiring layer UTL of the wires TL' may completely overlap or may partially non-overlap at edges or the like depending on process errors or the like (e.g., alignment errors). However, since the second wiring portions STL12' of the wires TL' may be disposed in an area not visually recognized by a user, the pattern see-through phenomenon of the wires TL' might not occur.

As in the above-described embodiments, the wires TL disposed in one portion NA21 of the second non-active area NA2 that is not covered by the light blocker LBM and the wires TL' disposed in one portion NA22 of the second non-active area NA2 covered by the light blocker LBM may have the same or different structures. For example, by comprehensively considering factors such as design conditions such as the area of a space in which the wires TL and TL' may be disposed, the resistance of the wires TL and TL', and a pattern see-through phenomenon, the wires TL disposed in one portion NA21 of the second non-active area NA2 that is not covered by the light blocker LBM and the wires TL' disposed in one portion NA22 of the second non-active area NA2 covered by the light blocker LBM may be formed to have the same structure or formed to have different structures.

In concluding the detailed description, those skilled in the art will appreciate that many variations and modifications can be made to the embodiments without substantially departing from the principles of the present invention.

What is claimed is:

1. A display device, comprising:
   a sensor layer comprising an active area and a non-active area at least partially surrounding the active area;
   a first sensor electrode disposed in the active area;
   a first wire disposed in the non-active area; and
   a light blocker disposed in the non-active area to surround the active area and having an opening exposing the active area and a portion of the non-active area disposed immediately proximate to the active area,
   wherein the first wire comprises:
      a first wiring portion electrically connected to the first sensor electrode, having at least a part thereof extending in a first direction, and comprising at least two wiring layers that overlap one another as the at least two wiring layers each extend in the first direction; and
      a second wiring portion electrically connected to the first wiring portion, extending in a second direction crossing the first direction, and comprising a single wiring layer, and
   wherein the second wiring portion is disposed in the portion of the non-active area overlapping the opening of the light blocker.

2. The display device of claim 1, wherein the first direction corresponds to a lengthwise direction or a vertical direction of the active area, and
   wherein the second direction corresponds to a widthwise direction or a horizontal direction of the active area.

3. The display device of claim 2, wherein the second wiring portion is proximate to a lower edge of the active area and extends parallel to the lower edge of the active area.

4. The display device of claim 1, wherein the non-active area comprises a first non-active area disposed on a left side or right side of the active area and extending in the first direction, and a second non-active area disposed on a lower side of the active area and extending in the second direction, and
   wherein the first wiring portion and the second wiring portion are disposed in the first non-active area and the second non-active area, respectively.

5. The display device of claim 4, wherein the first wire further comprises a third wiring portion extending in the first direction, from one end of the second wiring portion in the second non-active area, and comprising at least two wiring layers.

6. The display device of claim 5, wherein each of the first wiring portion and the third wiring portion comprises a first wiring layer and a second wiring layer overlapping the first wiring layer, and
   wherein the second wiring portion is disposed on a same layer as the first wiring layer or the second wiring layer.

7. The display device of claim 6, wherein the second wiring portion is integrally formed with either the first wiring layer or the second wiring layer.

8. The display device of claim 6, wherein each of the first wiring layer and the second wiring layer has a multilayer structure comprising a first metal layer including a first metal, a second metal layer disposed on the first metal layer and including a second metal, and a third metal layer disposed on the second metal layer and including a third metal, and
   wherein the first metal and the third metal each have a light reflectivity that is smaller than that of the second metal.

9. The display device of claim 6, wherein the sensor layer further comprises an insulating layer interposed between the first wiring layer and the second wiring layer, and
   wherein the first wiring layer and the second wiring layer are each electrically connected through a contact hole penetrating the insulating layer in each of the first wiring portion and the third wiring portion.

10. The display device of claim 4, further comprising:
   a second sensor electrode disposed in the active area; and
   a second wire disposed in the non-active area and electrically connected to the second sensor electrode,
   wherein the second wire comprises:
      a first wiring portion disposed in the second non-active area and extending in the first direction;
      a second wiring portion extending in the second direction from one end of the first wiring portion of the second wire in the second non-active area and comprising a single wiring layer; and
      a third wiring portion extending from one end of the second wiring portion of the second wire in the second non-active area in the first direction and comprising at least two wiring layers.

11. The display device of claim 1, further comprising:
   a substrate comprising the active area and the non-active area;
   a display layer disposed on the substrate and comprising pixels disposed in the active area; and
   an encapsulation layer disposed on the display layer and encapsulating the pixels,
   wherein the sensor layer is disposed on the encapsulation layer.

12. An electronic device, comprising:

a sensor layer comprising an active area and a non-active area at least partially surrounding the active area;

a sensor electrode disposed in the active area; and a wire disposed in the non-active area, and comprising a first wiring portion electrically connected to the sensor electrode and having at least a part thereof extending in a first direction, and a second wiring portion electrically connected to the first wiring portion and extending in a second direction crossing the first direction, wherein the second wiring portion comprises:

a first wiring layer extending in the second direction in the non-active area; and a second wiring layer disposed on an insulating layer covering the first wiring layer, extending in the second direction in the non-active area and overlapping the first wiring layer, and covering a top surface of the first wiring layer while having a width that is larger than that of the top surface of the first wiring layer.

13. The electronic device of claim 12, wherein the first direction corresponds to a lengthwise direction or a vertical direction of the active area, and wherein the second direction corresponds to a widthwise direction or a horizontal direction of the active area.

14. The electronic device of claim 13, wherein, the second wiring portion is disposed primate to a lower edge of the active area and extends parallel to the lower edge of the active area.

15. The electronic device of claim 12, further comprising a light blocker disposed in the non-active area and surrounding the active area, and having an opening exposing the active area and a portion of the non-active area disposed immediately proximate to the active area, wherein the second wiring portion is disposed in the portion of the non-active area overlapping the opening of the light blocker.

16. The electronic device of claim 12, wherein each of the first wiring layer and the second wiring layer has a multi-layer structure comprising a first metal layer containing a first metal, a second metal layer disposed on the first metal layer and containing a second metal, and a third metal layer disposed on the second metal layer and containing a third metal, and wherein the first metal and the third metal have a light reflectivity that is smaller than that of the second metal.

17. The electronic device of claim 16, wherein, at least one of the first metal layer and the third metal layer of the second wiring layer completely covers the second metal layer of the first wiring layer.

18. The electronic device of claim 12, wherein the non-active area comprises a first non-active area disposed on a left side or a right side of the active area and extending in the first direction, and a second non-active area disposed on a lower side of the active area and extending in the second direction, and wherein the first wiring portion and the second wiring portion are disposed in the first non-active area and the second non-active area, respectively.

19. The electronic device of claim 18, wherein the wire further comprises a third wiring portion extending in the first direction from one end of the second wiring portion in the second non-active area, and wherein each of the first wiring portion and the third wiring portion comprises:

a first wiring layer integral with the first wiring layer of the second wiring portion; and a second wiring layer disposed on the insulating layer, overlapping the first wiring layer of each of the first wiring portion and the third wiring portion, and integral with the second wiring layer of the second wiring portion.

20. An electronic device, comprising:

a sensor layer comprising an active area and a non-active area at least partially surrounding the active area;

a sensor electrode disposed in the active area; and a wire disposed in the non-active area, wherein the wire comprises:

a first wiring portion electrically connected to the sensor electrode, having at least a part thereof extending in a first direction, and comprising at least two wiring layers that overlap one another as the at least two wiring layers each extend in the first direction;

a second wiring portion electrically connected to the first wiring portion, extending in a second direction crossing the first direction, and comprising a single wiring layer; and a third wiring portion extending in the first direction from one end of the second wiring portion and comprising at least two wiring layers each extend in the first direction.

21. The electronic device of claim 20, wherein the first direction corresponds to a lengthwise direction or a vertical direction of the active area, and wherein the second direction corresponds to a widthwise direction or a horizontal direction of the active area.

22. The electronic device of claim 21, wherein, the second wiring portion is disposed proximate to a lower edge of the active area and extends parallel to the lower edge of the active area.

23. The electronic device of claim 20, wherein the non-active area comprises a first non-active area disposed on a left side or right side of the active area and extending in the first direction, and a second non-active area disposed on a lower side of the active area and extending in the second direction, and wherein the first wiring portion is disposed in the first no-active area, and the second wiring portion and the third wiring portion are disposed in the second non-active area.

* * * * *